(12) United States Patent
Grip et al.

(10) Patent No.: US 8,957,303 B2
(45) Date of Patent: Feb. 17, 2015

(54) STRAIN ISOLATION LAYER ASSEMBLIES AND METHODS

(75) Inventors: Robert Erik Grip, Rancho Palos Verdes, CA (US); Blaine Knight Rawdon, San Pedro, CA (US); Tab Hunter Crooks, Dana Point, CA (US); Michael F. Stoia, Rancho Santa Margarita, CA (US)

(73) Assignee: The Boeing Company, Chicago, IL (US)

( * ) Notice: Subject to any disclaimer, the term of this patent is extended or adjusted under 35 U.S.C. 154(b) by 298 days.

(21) Appl. No.: 13/286,202

(22) Filed: Oct. 31, 2011

(65) Prior Publication Data

US 2013/0104966 A1    May 2, 2013

(51) Int. Cl.
*F24J 2/46*   (2006.01)
*H01L 31/042*   (2014.01)

(52) U.S. Cl.
CPC ........ *H01L 31/0422* (2013.01); *B64D 2211/00* (2013.01); *Y02E 10/50* (2013.01)
USPC .......................................... 136/251; 126/709

(58) Field of Classification Search
CPC .................................................... H01L 31/048
USPC ....................................................... 136/251
See application file for complete search history.

(56) References Cited

U.S. PATENT DOCUMENTS

| | | | |
|---|---|---|---|
| 4,598,007 A | 7/1986 | Kourtides et al. | |
| 4,860,509 A * | 8/1989 | Laaly et al. | 52/173.3 |
| 6,005,184 A | 12/1999 | Barnes | |
| 7,743,763 B2 | 6/2010 | Grip et al. | |
| 7,762,495 B2 | 7/2010 | Miller | |
| 7,985,919 B1 | 7/2011 | Roscheisen et al. | |
| 8,158,450 B1 * | 4/2012 | Sheats et al. | 438/57 |
| 2004/0069897 A1 * | 4/2004 | Corcoran | 244/10 |
| 2008/0308153 A1 | 12/2008 | Grip | |
| 2009/0025712 A1 * | 1/2009 | Grip et al. | 126/709 |
| 2009/0184200 A1 | 7/2009 | Lin et al. | |
| 2009/0252920 A1 | 10/2009 | Khan et al. | |
| 2010/0132761 A1 | 6/2010 | Echizenya et al. | |

(Continued)

FOREIGN PATENT DOCUMENTS

| | | |
|---|---|---|
| EP | 2348543 A1 | 7/2011 |
| GB | 2300380 A | 11/1996 |
| GB | 2328079 A | 2/1999 |

(Continued)

OTHER PUBLICATIONS

AeroVironment, Inc. (AV): UAS Advanced Development Center, "UAS Advanced Development: Solar Challenger", Jul. 7, 1981, from Internet website at web address URL www.avinc.com/uas/adc/solar_challenger/, 1 page.

(Continued)

*Primary Examiner* — Jeffrey T Barton
*Assistant Examiner* — Uyen Tran

(57) ABSTRACT

In an embodiment of the disclosure, there is provided a strain isolation layer assembly. The assembly has a rigid solar layer; a strain isolation layer having a discontinuous configuration, a vertical rigidity, and a horizontal shear flexibility; and an underlying substrate layer. The strain isolation layer is coupled between the rigid solar layer and the underlying substrate layer to form a strain isolation layer assembly, such that the strain isolation layer isolates the rigid solar layer to reduce one or more strains induced on the rigid solar layer.

23 Claims, 25 Drawing Sheets

(56) References Cited

U.S. PATENT DOCUMENTS

2011/0017267 A1 1/2011 Lichy et al.
2011/0155222 A1* 6/2011 Ehbing et al. ................. 136/251

FOREIGN PATENT DOCUMENTS

| WO | WO2009149850 | * 12/2009 | ................. 136/251 |
| WO | WO 2011073303 | * 6/2011 | ................. 136/251 |

OTHER PUBLICATIONS

Shuttle Strain Isolation Pad, STS-1, at Smithsonian National Air and Space Museum, 1981, from Internet website at web address URL www.nasm.si.edu/collections/artifact.cfm?id=A19820050000, 1 page.

Machine Design, "Solar-powered UAV flies two days straight", Aug. 18, 2005, from Internet website at web address URL http://machinedesign.com/article/solar-powered-uav-flies-two-days-straight-0818, 2 pages.

Solar Flight News, Sunseeker Articles, May, 2008-Apr. 5, 2009, from Internet website at web address URL solar-flight.com/news/index.html, 3 pages.

PCT International Search Report and Written Opinion of the International Searching Authority for Counterpart International Application No. PCT/US2012/057486, ISR Mailed Jul. 24, 2013, Applicant The Boeing Company, 12 pages.

PCT International Preliminary Report on Patentability and Written Opinion of the International Searching Authority for Counterpart International Application No. PCT/US2012/057486, Mailed May 15, 2014, Applicant The Boeing Company, 9 pages.

* cited by examiner

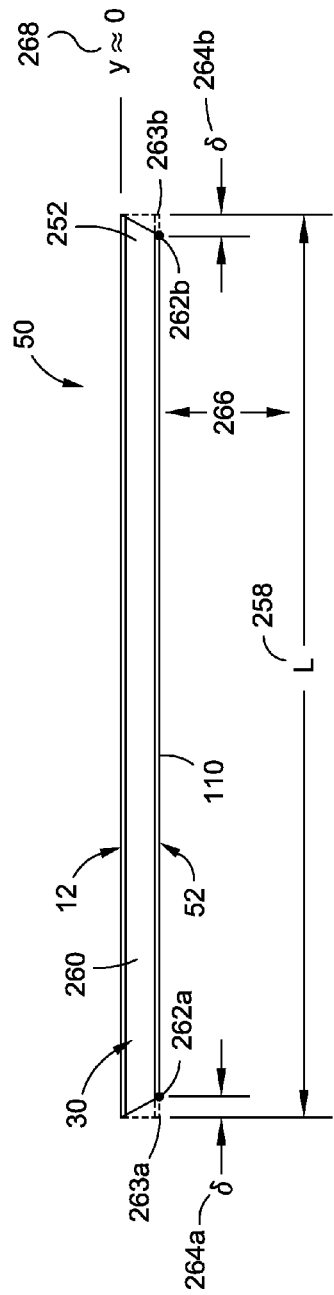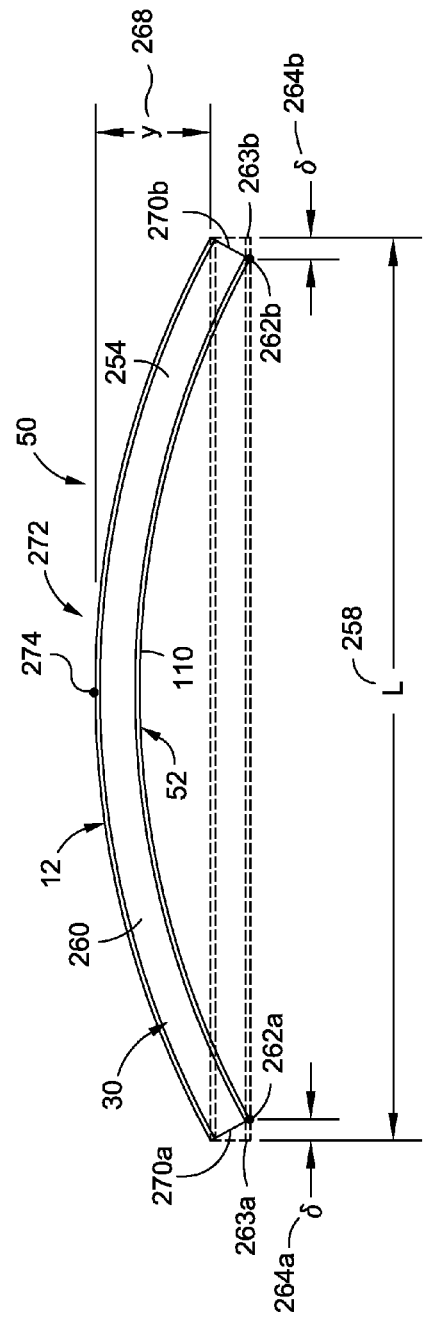
FIG. 3A
FIG. 3B

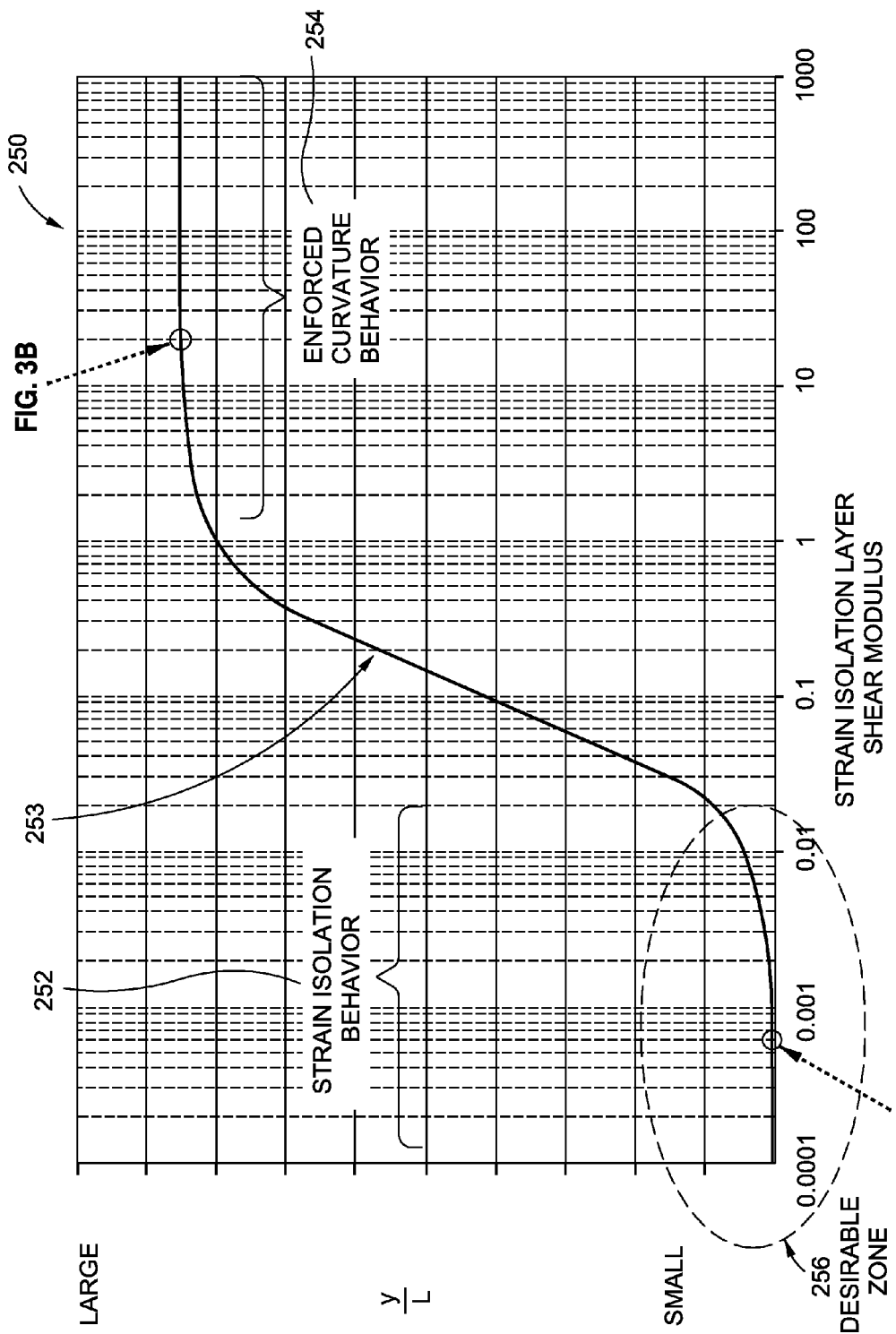

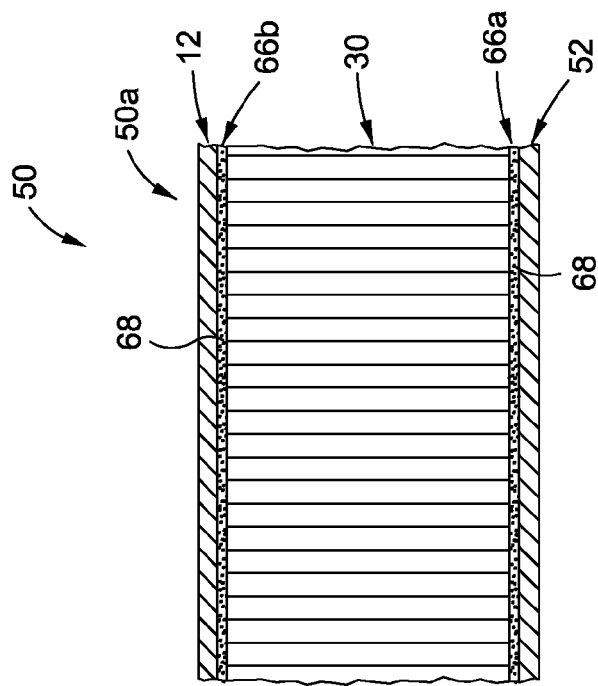
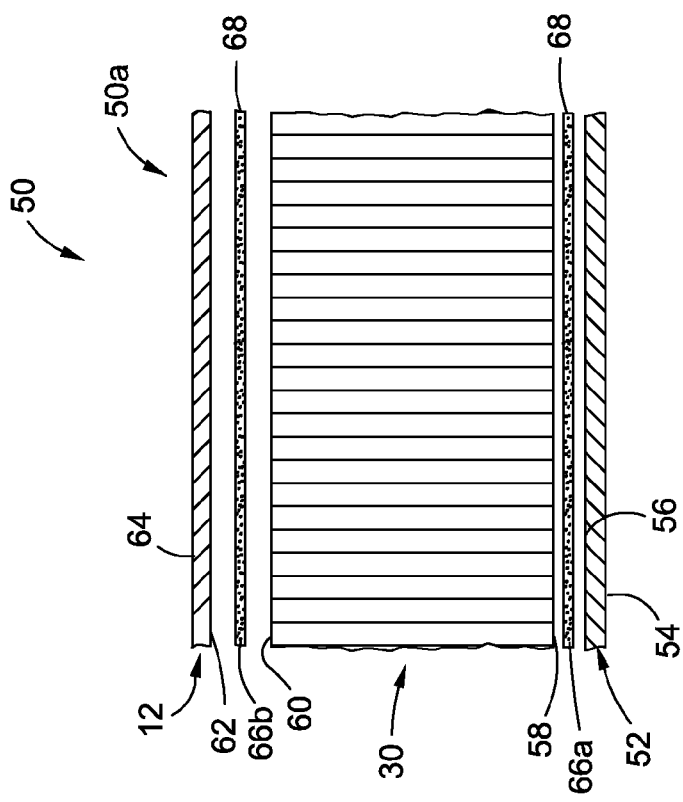
FIG. 4B
FIG. 4A

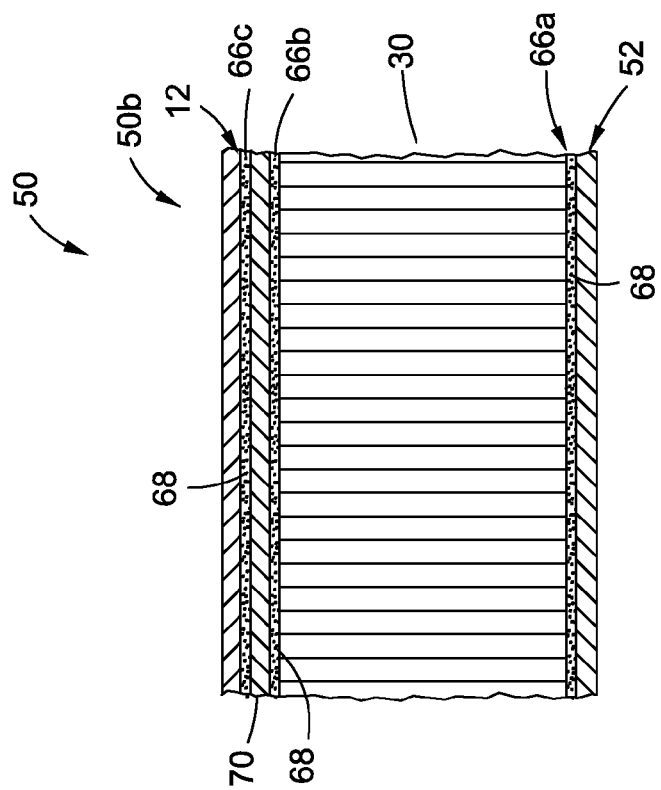
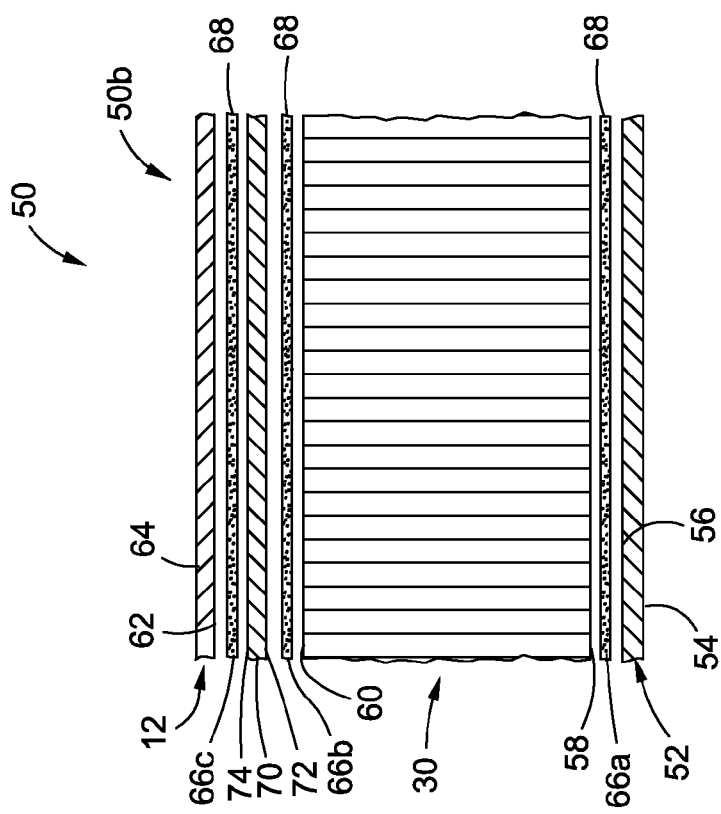
FIG. 5B
FIG. 5A

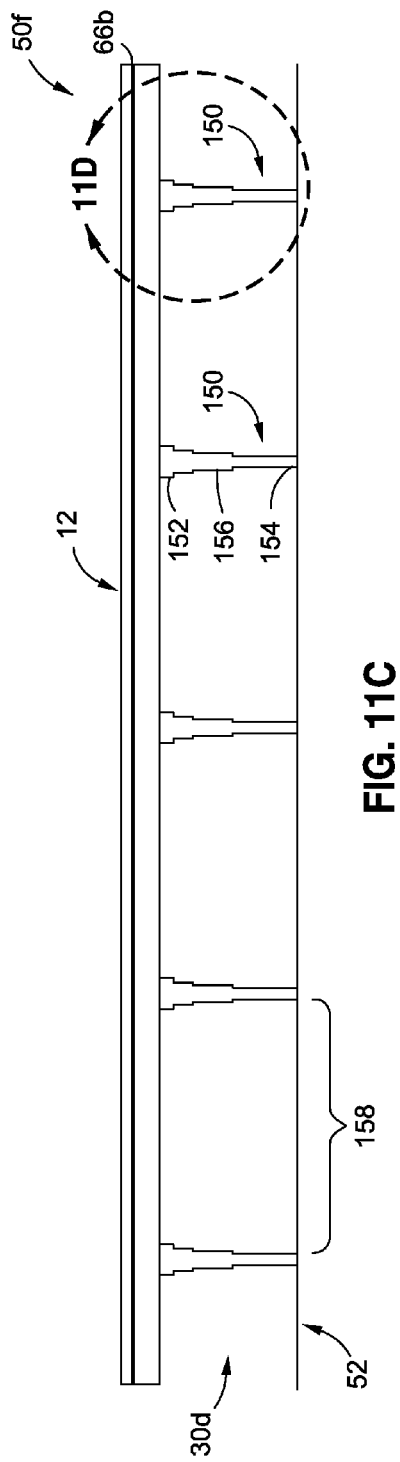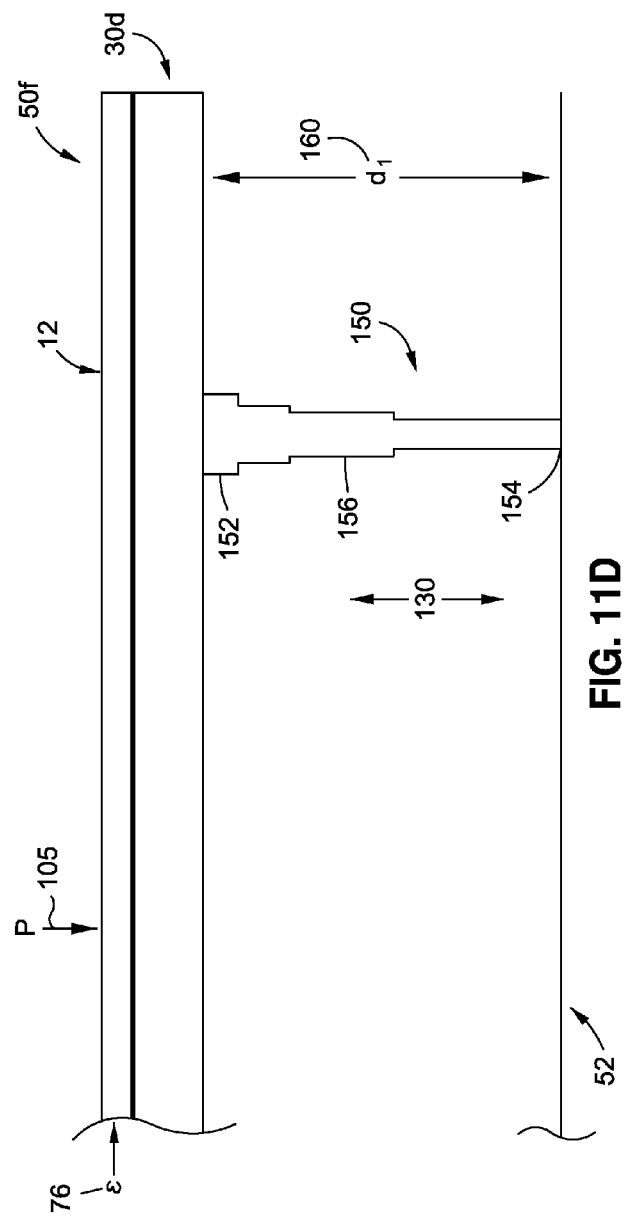
FIG. 11C
FIG. 11D

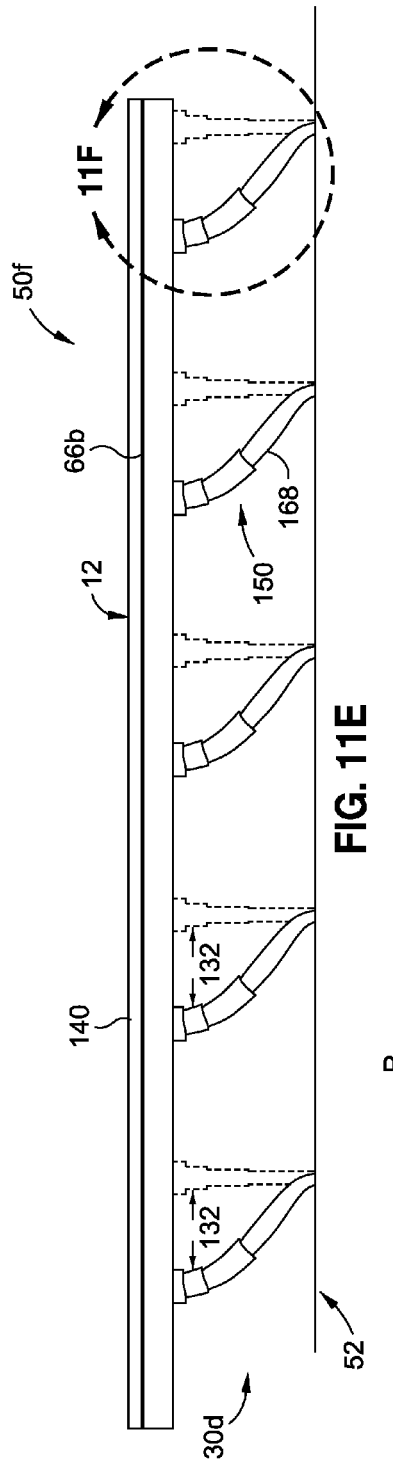
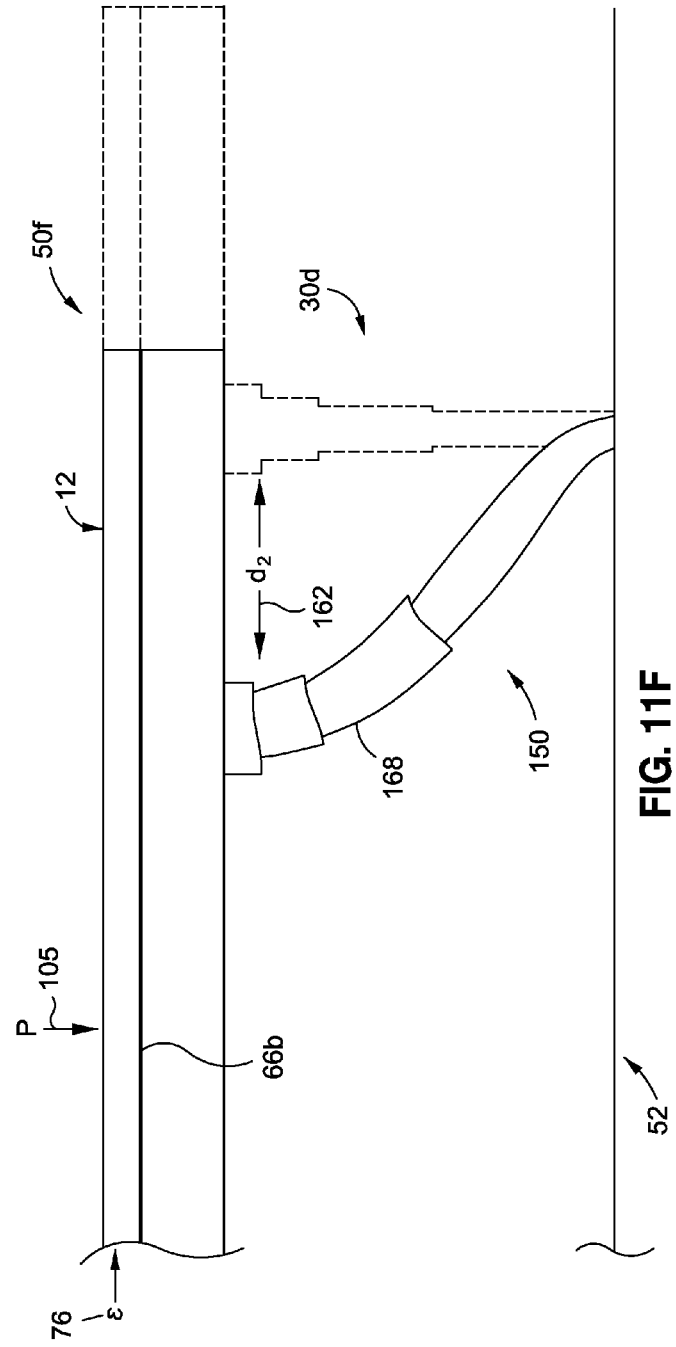
FIG. 11E
FIG. 11F

STRAIN ISOLATION LAYER ASSEMBLIES AND METHODS

REFERENCE TO GOVERNMENT CONTRACT

This invention was made with Government support under Agreement No. HR0011-10-9-0010 awarded by Defense Advanced Research Projects Agency (DARPA). The government has certain rights in this invention.

BACKGROUND

1) Field of the Disclosure

The disclosure relates generally to solar layers and solar panels mounted on structures, and more particularly, to assemblies and methods for improved mounting of such solar layers and solar panels on structures.

2) Description of Related Art

Solar technologies are increasingly being used to harvest solar energy and to power various vehicles and devices. For example, solar layers and panels, such as individual photovoltaic solar cells, or solar panel arrays comprised of photovoltaic solar cells, may be mounted to structures, such as transport vehicles and terrestrial and space-based structures, to harvest and convert solar energy into useful outputs such as electrical energy.

Solar powered vehicles are typically vehicles powered completely or significantly by solar energy. Existing solar powered vehicles include solar powered unmanned aerial vehicles (UAVs) that may be capable of achieving flight durations of from several months to years without requiring landing or refueling. Such UAVs typically may employ photovoltaic solar cells located on their exterior surfaces, primarily their wing surfaces, to capture solar energy.

However, the connection or mounting of known photovoltaic solar cells or solar panels to structures, such as solar powered UAVs or other aircraft and vehicles, or terrestrial and space-based structures, may present difficulties.

Known photovoltaic solar cells or solar panel arrays may be brittle and may have limited use if exposed to excessive levels of strain. For purposes of this application, "strain" is defined as a dimensionless measure of deformation of a body and is quantified as a change in length of the body divided by the original length of the body. For example, an object that is one hundred (100) inches long is subjected to one percent (1%) strain if it is stretched one (1) inch. In addition, the strain limit at which known photovoltaic solar cells or solar panels may discontinue working may be well below the strain limit at which a vehicle, such as an aircraft or aerial vehicle, may discontinue working. Thus, the direct connection or mounting of thin photovoltaic solar cells or solar arrays to a vehicle, such as an aircraft or aerial vehicle, may result in the photovoltaic solar cells or solar arrays being forced to approximate the same strain levels as the aircraft or aerial vehicle structure. In turn, this may result in the photovoltaic solar cells or solar arrays ceasing to function properly.

With regard to aircraft or aerial vehicles, strains may be induced on wing mounted photovoltaic solar cells or solar arrays by structural wing flexure resulting from aircraft or aerial vehicle lift loads. Moreover, with regard to aircraft or aerial vehicles, thermal strains may be induced on photovoltaic solar cells or solar arrays if they are bonded or attached to materials with different coefficients of thermal expansion (CTEs) when the temperature changes. For purposes of this application, "coefficient of thermal expansion" means the amount a material will expand for each degree of temperature increase. Different materials expand at different rates, and rates may be expressed as strain per change in temperature. If the connected materials have different CTEs, then the materials may induce thermal strains on each other. If the connected materials have the same or similar CTEs and the materials are subjected to different temperatures, then thermal strains may also be induced in each material.

Further, known thin, planar photovoltaic solar cells or solar panel arrays may be easily deformed to follow a single-curvature shape. For example, such solar cells or solar panel arrays may be curved to follow the wing upper surface airfoil of an aircraft or aerial vehicle. However, unsupported thin solar cells or solar panel arrays may buckle when subjected to compressive strains. Significant buckling may occur even at very low strain levels. Such buckling may disrupt or prevent laminar flow affecting flight characteristics of the aircraft or aerial vehicle or may damage such unsupported solar cells or solar panel arrays. In addition, thin, planar photovoltaic solar cells or solar panel arrays that follow a single-curvature shape may form wrinkles when subjected to compressive strains in a direction perpendicular to the curvature, for example, spanwise compression on a solar cell or solar panel array that follows a wing upper surface curvature. Significant wrinkling may form even at very low strain levels. For purposes of this application, "wrinkling" means a complex buckling pattern with diagonal peaks and valleys, in contrast to a simple buckling pattern with parallel, sinusoidal waves. Such wrinkling may disrupt or prevent laminar flow or may damage such solar cells or solar panel arrays.

In addition, known assemblies and methods exist for connecting or mounting known photovoltaic solar cells or solar panels to surfaces of structures, such as solar powered UAVs or other aircraft and vehicles, or terrestrial and space-based structures. In one known assembly and method for connecting or mounting known photovoltaic solar cells to the surface of a structure, such as a solar powered UAV or aircraft, individual photovoltaic solar cells may be mounted to a wing surface with an adhesive or a double-sided adhesive tape. Gaps between the photovoltaic solar cells may be provided to accommodate strains in the underlying structure without overloading the individual photovoltaic solar cells. The photovoltaic solar cells may be connected electrically with flexible material such as expanded metal mesh. However, with such known assembly and method, the gaps and connections between the photovoltaic solar cells may disrupt laminar flow. Moreover, with such known assembly and method, the cost of mounting or connecting numerous individual photovoltaic solar cells to the wing or other surface of an aircraft or aerial vehicle or other terrestrial and space-based structures, may increase due to increased time, complexity and labor that may be required to mount or connect such solar cells. Finally, with such known assembly and method, forces exerted by the electrical connection between the photovoltaic solar cells on the solar cells themselves may result in the solar cells being thicker and heavier than needed.

In another known assembly and method for connecting or mounting known photovoltaic solar cells to the surface of a structure, such as a solar powered UAV or aircraft, individual photovoltaic solar cells may be cast in a mold with an aircraft wing skin structure, thus becoming a fully integral part of an aircraft wing structure. However, with such known assembly and method, the aircraft wing structure may require reinforcement to limit strain in service to levels below that which may be tolerated by the photovoltaic solar cells. This may result in a substantial increase in the weight of the aircraft wing structure. Moreover, with such known assembly and method, solar cells may be difficult to remove and replace. Thus, a damaged solar cell may result in the entire aircraft wing being scrapped or may result in a costly repair process. Finally, with such known assembly and method, it may not be known until after the aircraft wing is finished whether the solar cells may be working properly. If the solar cells are not working properly after assembly, for example, if the solar cells are damaged during assembly, this may result in a costly repair process.

Accordingly, there is a need in the art for improved assemblies and methods for connecting photovoltaic solar cells and solar panel arrays to structures, for reducing strains on the solar cells and solar panel arrays, and for providing advantages over known assemblies, devices and methods.

SUMMARY

This need for improved assemblies and methods for connecting photovoltaic solar cells and solar panel arrays to structures and for reducing strains on the solar cells and solar panel arrays is satisfied. As discussed in the below detailed description, embodiments of the improved assemblies and methods may provide significant advantages over known assemblies, devices and methods.

In an embodiment of the disclosure, there is provided a strain isolation layer assembly. The assembly comprises a rigid solar layer. The assembly further comprises a strain isolation layer having a discontinuous configuration, a vertical rigidity, and a horizontal shear flexibility. The assembly further comprises an underlying substrate layer. The strain isolation layer is coupled between the rigid solar layer and the underlying substrate layer to form a strain isolation layer assembly, such that the strain isolation layer isolates the rigid solar layer to reduce one or more strains induced on the rigid solar layer.

In another embodiment of the disclosure, there is provided an aircraft comprising a strain isolation layer having a discontinuous configuration, a vertical rigidity, and a horizontal shear flexibility. The strain isolation layer joins a rigid solar layer to a surface of a flexible aircraft wing, such that the strain isolation layer isolates the rigid solar layer to reduce one or more strains induced on the rigid solar layer.

In another embodiment of the disclosure, there is provided a method of reducing one or more strains on a rigid solar layer. The method comprises providing a strain isolation layer having a discontinuous configuration, a vertical rigidity, and horizontal shear flexibility. The method further comprises attaching the strain isolation layer between a rigid solar layer and an underlying substrate layer, such that the strain isolation layer isolates the rigid solar layer to reduce one or more strains induced on the rigid solar layer. The method further optionally comprises attaching an added layer between the strain isolation layer and the rigid solar layer.

The features, functions, and advantages that have been discussed can be achieved independently in various embodiments of the disclosure or may be combined in yet other embodiments further details of which can be seen with reference to the following description and drawings.

BRIEF DESCRIPTION OF THE DRAWINGS

The disclosure can be better understood with reference to the following detailed description taken in conjunction with the accompanying drawings which illustrate preferred and exemplary embodiments, but which are not necessarily drawn to scale, wherein:

FIG. 3A is an enlarged front view of a strain isolation layer assembly having a strain isolation layer with a low shear modulus;

FIG. 3B is an enlarged front view of the strain isolation layer assembly of FIG. 3A having a strain isolation layer with a high shear modulus;

FIG. 3C is an illustration of a graph showing vertical deflections of a strain isolation layer varying as a function of the shear modulus of the strain isolation layer;

FIG. 4A is an illustration of an exploded cross-sectional view of one of the embodiments of a strain isolation layer assembly of the disclosure;

FIG. 4B is an illustration of an assembled cross-sectional view of the strain isolation layer assembly of FIG. 4A;

FIG. 5A is an illustration of an exploded cross-sectional view of another one of the embodiments of a strain isolation layer assembly of the disclosure;

FIG. 5B is an illustration of an assembled cross-sectional view of the strain isolation layer assembly of FIG. 5A;

FIG. 11C is an illustration of a front view of the foam blade support strain isolation layer of FIG. 11B;

FIG. 11D is an illustration of a front close-up view of circled portion 11D of FIG. 11C;

FIG. 11E is an illustration of a front view the foam blade support strain isolation layer of FIG. 11B showing horizontal deflections of the foam blades;

FIG. 11F is an illustration of a front close-up view of circled portion 11F of FIG. 11E;

DETAILED DESCRIPTION

Disclosed embodiments will now be described more fully hereinafter with reference to the accompanying drawings, in which some, but not all of the disclosed embodiments are shown. Indeed, several different embodiments may be provided and should not be construed as limited to the embodiments set forth herein. Rather, these embodiments are provided so that this disclosure will be thorough and complete and will fully convey the scope of the disclosure to those skilled in the art.

Figure 1:
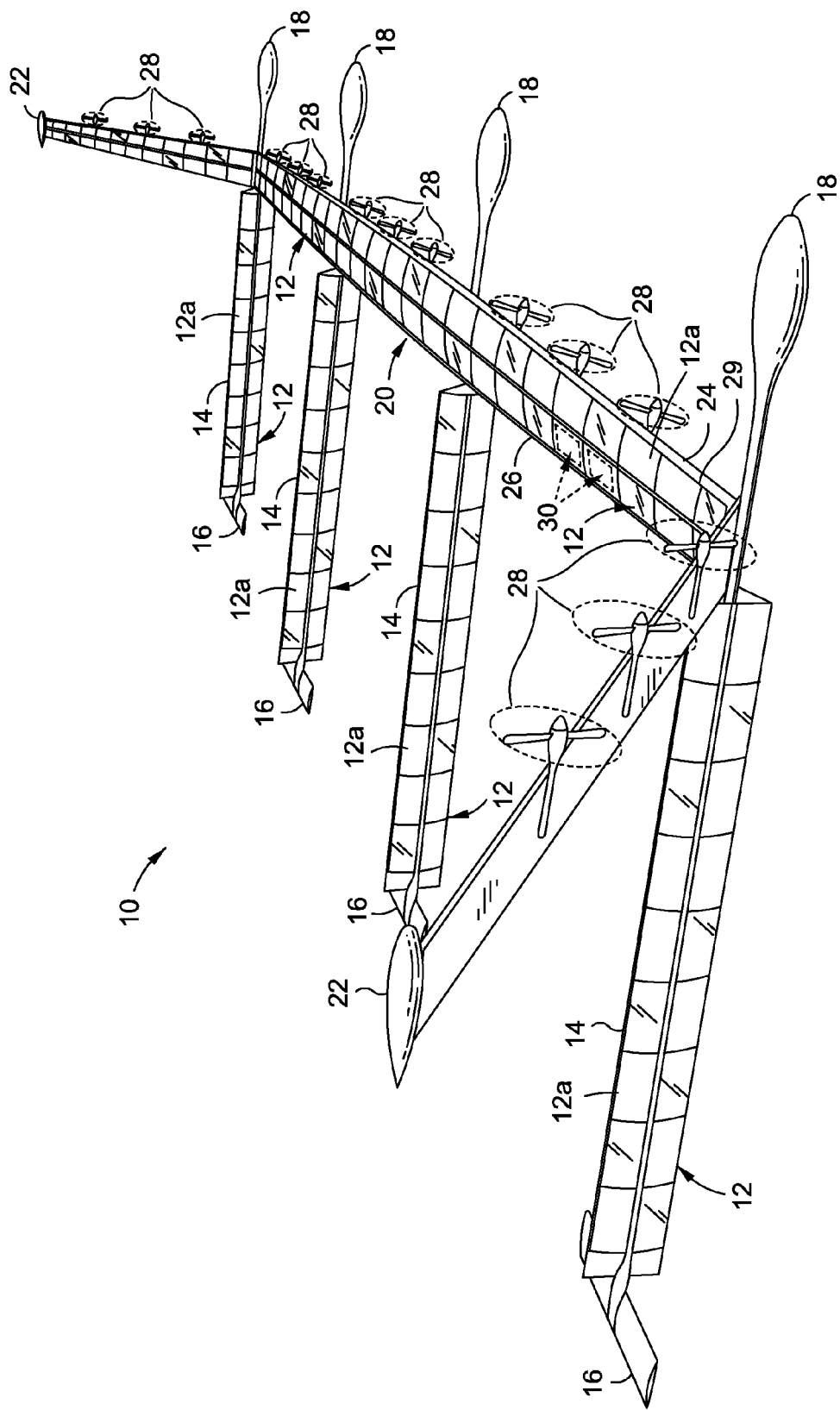
FIG. 1 is an illustration of a perspective view of an aircraft which may incorporate one or more advantageous embodiments of a strain isolation layer assembly of the disclosure.

Now referring to the Figures, FIG. 1 is an illustration of a perspective view of an aircraft 10 which may incorporate one or more advantageous embodiments of a strain isolation layer assembly 50, 50a-50h, 50j (see FIGS. 4A-13C) of the disclosure. As shown in FIG. 1, the aircraft 10 is preferably solar powered and comprises one or more rigid solar layers 12, such as in the form of solar panels 12a. As further shown in FIG. 1, the aircraft 10 further comprises fuselages 14, tails 16, control system housings 18, a wing 20 having wing tips 22 and a wing leading edge 24 and a wing trailing edge 26, and propeller elements 28. The rigid solar layers 12, such as in the form of solar panels 12a, are preferably mounted to an upper surface 29 of the wing 20, as this location exposes the solar layers 12, such as solar panels 12a, to sunlight in a way favorable for many flight conditions. The performance of the aircraft 10 may be improved by achieving laminar flow on the upper surface 29 of the wing 20 with a combination of aircraft shape and the upper surface 29 being very smooth. The solar panels 12a may also be mounted to the fuselages 14 of the aircraft 10. The aircraft 10 preferably incorporates one of the embodiments of the strain isolation layer assembly 50, 50a-50h, 50j on the wing 20 or another area of the aircraft 10 having rigid solar layers 12, such as the fuselages 14. The aircraft 10 may be made from composite and/or metallic materials that may be used on one or more portions of the aircraft 10.

Although the aircraft 10 shown in FIG. 1 is generally representative of an unmanned solar powered aircraft, embodiments of the strain isolation layer assembly 50, 50a-50h, 50j, as disclosed herein, may also be employed in other types of solar powered aircraft or aircraft having solar layers. More specifically, the teachings of the disclosed embodiments may be applied to other passenger aircraft, cargo aircraft, military aircraft, rotorcraft and other types of aircraft or aerial vehicles that are solar powered or that have solar layers. In addition, the disclosed embodiments may be applied to aerospace vehicles, satellites, space launch vehicles, rockets, and other aerospace vehicles that are solar powered or that have solar layers. It may also be appreciated that embodiments of assemblies, devices, methods, and systems in accordance with the disclosure may be utilized in other transport vehicles, such as boats and other watercraft, trains, automobiles, trucks, buses, or other suitable transport vehicles that are solar powered or that have solar layers. It may further be appreciated that embodiments of assemblies, devices, methods, and systems in accordance with the disclosure may be used in various structures, such as commercial and residential buildings, or other suitable architectural structures, that are solar powered or that use solar layers.

FIG. 3A is an enlarged front view of a strain isolation layer assembly 50 having a strain isolation layer 30 with a low shear modulus and a strain isolation behavior 252 (see also FIG. 3C) that is desirable. FIG. 3A shows the strain isolation layer 30 having a length (L) 258. The strain isolation layer 30, such as in the form of a middle layer 260, effectively isolates an underlying substrate layer 52, such as in the form of an aircraft wing skin 110, from a rigid solar layer 12. If the underlying substrate layer 52 is in a state of pre-tension, and contracts as a result of mechanical loads or change in temperature, it will tend to either expand (not shown), or contract (shown) to positions 262a, 262b. Thus, lower ends 263a, 263b of the underlying substrate layer 52 will each move a distance (δ) 264a, 264b, respectively. If the shear modulus of the strain isolation layer 30 is a very low value and the modulus of elasticity in a vertical direction 266 of the strain isolation layer 30 is a reasonably large number (e.g. more than 500 psi (pounds per square inch)), negligible forces will be transmitted to the rigid solar layer 12, and thus, the rigid solar layer 12 will not experience significant deflections, strain, or stress. As shown in FIG. 3A, a distance of a deflection (y) 268 is approximately zero (0).

FIG. 3B is an enlarged front view of the strain isolation layer assembly 50 of FIG. 3A having a strain isolation layer 30 with a high shear modulus and an enforced curvature behavior 254 (see also FIG. 3C). The high shear modulus of the strain isolation layer 30, in the form of middle layer 260, causes the strain isolation layer 30 to function less as a strain isolation layer 30 and more as the middle layer 260 being a stiff shear web, which results in the enforced curvature behavior 254. The high shear modulus of the strain isolation layer 30, in the form of the middle layer 260, results in a significantly different behavior when the underlying substrate layer 52 experiences extensional strain, either expansion (not shown), or contraction (shown) to positions 262a, 262b. In this embodiment, the high shear modulus of the strain isolation layer 30, such as in the form of the middle layer 260, is effective in coupling the underlying substrate layer 52, such as in the form of aircraft wing skin 110, with the rigid solar layer 12. Although lower ends 263a, 263b of the underlying substrate layer 52 will each still move a distance (δ) 264a, 264b, respectively, the embodiment illustrated in FIG. 3B has the strain isolation layer 30, such as in the form of the middle layer 260, with a shear modulus of sufficient magnitude, such that the shear forces resulting from them being tightly coupled, transmits the shear forces in a relatively small distance from ends 270a, 270b of the strain isolation layer 30, and effectively results in a moment being applied to the ends 270a, 270b of the strain isolation layer 30. This small "load transfer length" also results in the shear forces being small over the rest of the length (L) 258 of the strain isolation layer 30, and the strain isolation layer 30, as well as the strain isolation layer assembly 50, experiencing nearly constant curvature, such that the strain isolation assembly 50, including the strain isolation layer 30, bends upward in a substantially curved shape 272. The magnitude of the curvature of the strain isolation layer assembly 50, including the strain isolation layer 30, may be measured by a vertical distance of deflection (y) 268 that the strain isolation layer assembly 50 experiences at a center position 274 of the substantially curved shape 272. Thus, when the shear modulus of the strain isolation layer 30, in the form of the middle layer 260, is increased to a certain value, the strain isolation layer 30 functions less or no longer functions to isolate strain and functions more as the middle layer 260 being the stiff shear web, resulting in the curved shape 272, deflection (y) 268, and enforced curvature behavior 254.

FIG. 3C is an illustration of a graph 250 showing how deflections of a strain isolation layer 30 vary as a function of the shear modulus of the strain isolation layer 30. FIG. 3C is an illustration of a graph 250 showing how the deflection (y) 268 which measures the curvature of the strain isolation layer 30 (see FIGS. 3A-3B), varies as a function of the effective shear modulus of the strain isolation layer 30. For large values of shear modulus of the strain isolation layer 30, such as in the form of the middle layer 260 (see FIGS. 3A-3B), the middle layer 260 is not effective in isolating the underlying substrate layer 52 (see FIGS. 3A-3B) from the rigid solar layer 12 (see FIGS. 3A-3B). This portion of the graph 250 is an enforced curvature behavior portion 254. For very small values of the shear modulus of the strain isolation layer 30, the strain isolation layer 30 is very effective in isolating the underlying substrate layer 52 from the rigid layer 12. This portion of the graph 250 is a strain isolation behavior portion 252. Between the strain isolation behavior portion 252 and the enforced curvature behavior portion 254 is a transition region portion 253 of the graph 250 showing the range of shear modulus in which the strain isolation layer 30 is partially effective. As shown in FIG. 3C, preferably, embodiments of the strain isolation layer 30 disclosed herein achieve the strain isolation behavior 252 in a desirable zone 256, indicated as FIG. 3A on the graph 250. The FIG. 3A indication on graph 250 is representative of the strain isolation behavior 252 that is desirable for the strain isolation layer 30 shown in FIG. 3A. As shown in FIG. 3C, the FIG. 3B indication on graph 250 is representative of the enforced curvature behavior 254 of the strain isolation layer 30 shown in FIG. 3B.

Depending on the requirements of the aircraft 10 or other vehicle incorporating one or more embodiments of the strain isolation layer assembly 50, 50a-50h, 50j (see FIGS. 4A-13C) that may depend on allowable strain limits of the rigid solar array 12 or maximum permissible curvature or waviness of the rigid solar array 12 on top of the underlying substrate layer 52, such as an aircraft wing skin 110, due to aerodynamic smoothness requirements, a larger or smaller shear flexibility (or smaller or larger shear modulus) may be required of the strain isolation layer 30. Embodiments of the strain isolation layer assembly 50, 50a-50h, 50j (see FIGS. 4A-13C) and method 300 disclosed herein preferably achieve a very small shear modulus while maintaining a reasonable elastic modulus.

In an embodiment of the disclosure, there is provided a strain isolation layer assembly 50, 50a-50h, 50j (see FIGS. 4A-13C). FIGS. 4A-4B illustrate one of the embodiments of the strain isolation layer assembly 50, for example, in the form of a strain isolation layer assembly 50a. FIG. 4A is an illustration of an exploded cross-sectional view of the strain isolation layer assembly 50a of the disclosure. FIG. 4B is an illustration of an assembled cross-sectional view of the strain isolation layer assembly 50, for example, strain isolation layer assembly 50a of FIG. 4A. As shown in FIG. 4A, the strain isolation layer assembly 50, for example, strain isolation layer assembly 50a comprises a rigid solar layer 12 having a first surface 62 and a second surface 64. The rigid solar layer 12 may comprise one or more solar panels 12a (see FIG. 1), one or more solar cells 40 (see FIG. 2), a solar panel array 12b (see FIG. 2) comprising one or more solar modules 38 (see FIG. 2) of solar cells 40, a solar panel laminated assembly 46 (see FIG. 2), or another suitable solar layer. The rigid solar layer 12 is preferably thin and preferably has a thickness in a range of from about 0.0060 inch to about 0.030 inch. The rigid solar layer 12 of the disclosure is preferably lightweight and stable. Preferably, the strain isolation layer assembly 50, 50a-50h, 50j provides a rigid solar layer 12 that does not buckle when compressed, and in particular, that when used on aircraft or other aerial vehicles, does not buckle from flight loads or temperature changes.

Figure 2:
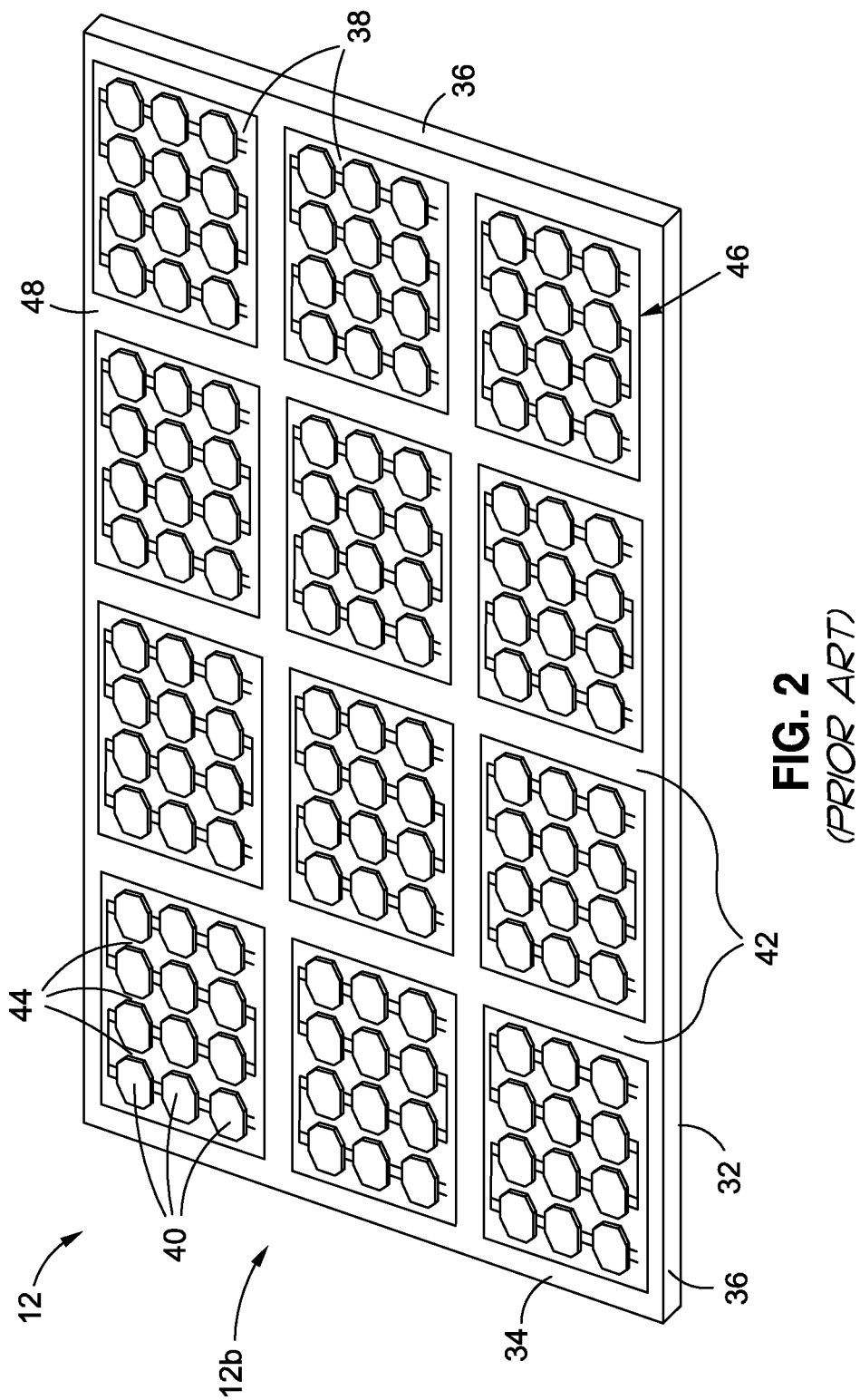
FIG. 2 is an illustration of a front perspective view of a known solar panel array that may be used in one of the embodiments of a strain isolation layer assembly of the disclosure.

FIG. 2 is an illustration of a front perspective view of a known rigid solar layer 12 comprising a solar panel array 12b that may be used in one of the embodiments of the strain isolation layer assembly 50, 50a-50h, 50j (see FIGS. 4A-13C) of the disclosure. As shown in FIG. 2, the solar panel array 12b comprises a first surface 32, a second surface 34, and sides 36. A plurality of solar modules 38 are mounted to the second surface 34. Each solar module 38 comprises a plurality of solar cells 40. Each solar cell 40 may typically be between about one inch square and about five inches square in size and may have a thickness of about 0.002 inch thick. Each solar module 38 may be separated by a solar module gap 42. Each solar cell 40 may be separated by a solar cell gap 44. The solar cells 40 may be mounted on the upper surface 29 (see FIG. 1) of the wing 20 (see FIG. 1), and may prevent laminar flow due to the solar cell gaps 44 between the solar cells 40. To provide a very smooth surface, the solar cells 40 may be joined in the solar panel array 12b. Preferably, the solar panel array 12b comprises a solar panel laminated assembly 46 (see FIG. 2) that provides a very smooth and planar surface 48. The solar panel array 12b may be mounted on the upper surface 29 (see FIG. 1) of the wing 20 (see FIG. 1) in a way that preserves its smoothness. The solar panel array 12b is typically large in size and may be greater than three to four feet wide and eight to ten feet long. However, the solar panel array 12b may be another suitable larger or smaller size.

The strain isolation layer assembly 50, 50a-50h, 50j (see FIGS. 4A-13C) further comprises a strain isolation layer 30, such as in the form of strain isolation layer embodiments strain isolation layers 30a-30g (see FIGS. 4A-13C), also referred to as a strain isolation pad, having a discontinuous configuration 80 (see FIGS. 6, 7, 10, 11B, 12), a vertical rigidity 130 (see FIGS. 6, 7, 10, 11D), and a horizontal shear flexibility 132 (see FIGS. 6, 7, 10, 11D). The vertical rigidity 130 is preferably oriented in an out-of-plane direction $d_1$ 160 (see FIG. 11D) that is substantially vertical. The horizontal shear flexibility 132 is preferably oriented in an in-plane direction $d_2$ 162 (see FIG. 11F) that is substantially horizontal. As shown in FIG. 4A, the strain isolation layer 30 comprises a first surface 58 and a second surface 60. The strain isolation layer 30 preferably has a thickness in a range of from about 0.10 inch to about 1.00 inch. Various embodiments of the strain isolation layer 30, such as in the form of strain isolation layer embodiments 30a-30g (see FIGS. 4A-13C), are discussed in further detail below.

The strain isolation layer 30, such as in the form of strain isolation layer embodiments 30a-30g, preferably comprises a flexible material. The flexible material may comprise a flexible foam such as foams made of one or more of silicone, polyurethane, melamine, polyvinyl fluoride (PVF), polyvinyl chloride (PVC), urethane, vinyl, polyethylene, acrylic, polyester, polypropylene, polyethylene, polyimide, or another suitable flexible foam material. The flexible material may further comprise a flexible fiber or fabric material such as polyester, nylon, polytetrafluorethylene (PTFE), or another suitable flexible fiber or fabric material. The flexible material may further comprise another suitable flexible material.

The strain isolation layer 30, such as in the form of strain isolation layer embodiments 30a-30g, is preferably stiff in tension and compression and exhibits a vertical rigidity 130 (see FIG. 11D) in an out-of-plane direction $d_1$ 160 (see FIG. 11D), and is preferably soft or flexible and exhibits horizontal shear flexibility 132 (see FIG. 11F) in an in-plane direction $d_2$ 162 (see FIG. 11F). The vertical rigidity 130 of the strain isolation layer 30, such as in the form of strain isolation layer embodiments 30a-30g, preferably helps to stabilize the rigid solar layer 12 to resist compressive buckling and wrinkling. The strain isolation layer 30, such as in the form of strain isolation layer embodiments 30a-30g, preferably has a shear modulus of about 0.03 psi (pounds per square inch) to about 1 psi. More preferably, the strain isolation layer 30, such as in the form of strain isolation layer embodiments 30a-30g, has a shear modulus of about 0.003 psi to about 0.01 psi. Most preferably, the strain isolation layer 30, such as in the form of strain isolation layer embodiments 30a-30g, has a shear modulus of about 0.001 psi. The shear modulus may also depend on the thickness of the strain isolation layer 30, such as strain isolation layers 30a-30g, used.

The strain isolation layer 30 preferably isolates the rigid solar layer 12 to reduce one or more strains (c) 76 (see FIGS. 11D, 11F) that may be induced on the rigid solar layer 12. The one or more strains may occur as a result of mechanical loads or changes in temperature. The one or more strains may comprise a mechanical strain such as a compressive strain, a tensile strain or a torsional strain. The one or more strains may further comprise a thermal strain such as a differential thermal expansion strain relating to coefficients of thermal expansion of each material in a subsystem, or another type of strain. In addition, by reducing strains imposed on the rigid solar layer 12, the strain isolation layer 30 reduces one or more stresses a that may be induced on the rigid solar layer 12.

The strain isolation layer assembly 50, 50a-50h, 50j (see FIGS. 4A-13C) further comprises an underlying substrate layer 52 (see FIGS. 4A-13C). As shown in FIG. 4A, the underlying substrate layer 52 comprises a first surface 54 and a second surface 56. The underlying substrate layer 52 may comprise an aircraft 10 (see FIG. 1), for example, an aircraft wing skin 110 (see FIG. 6), a spacecraft, a satellite, a space station, a rotorcraft, a watercraft, an automobile, a truck, a bus, an architectural structure, such as an architectural structure on earth or an architectural structure on a lunar or martian base, or another suitable structure. Preferably, the strain isolation layer assembly 50, 50a-50h, 50j isolates the rigid solar layer 12 from the underlying substrate layer 52, such as the aircraft wing skin 110, to reduce or minimize induced strains and stresses on the rigid solar layer 12 from the aircraft wing skin 110.

When the underlying substrate layer 52 is an aircraft 10 (see FIG. 1), the vertical rigidity 130 of the strain isolation layer 30 may transfer aerodynamic lift loads from the rigid solar layer 12 to the underlying substrate layer 52. The horizontal shear flexibility 132 preferably reduces a structural strain and a thermal strain from the underlying substrate layer 52 to the rigid solar layer 12.

As shown in FIGS. 4A-4B, preferably, the strain isolation layer 30 is coupled between the rigid solar layer 12 and the underlying substrate layer 52 to form the strain isolation layer assembly 50, for example, the strain isolation layer assembly 50a. As shown in FIGS. 4A-4B, the underlying substrate layer 52 may be coupled or bonded to the strain isolation layer 30 via a first bonding element layer 66a, preferably in the form of an adhesive 68, and the strain isolation layer 30 may be coupled or bonded to the solar layer 12 via a second bonding element layer 66b, preferably in the form of adhesive 68. However, depending on the adhered materials, other suitable bonding element layers may be used, such as those formed by fusion bonding, melting which is the equivalent of welding for non-metal materials, or another suitable bonding process.

FIGS. 5A-5B illustrate another one of the embodiments of the strain isolation layer assembly 50, in the form of a strain isolation layer assembly 50b having an added layer 70. The added layer 70 may be present to facilitate ease of manufacturing the strain isolation layer assembly 50. FIG. 5A is an illustration of an exploded cross-sectional view of the strain isolation layer assembly 50b of the disclosure. FIG. 5B is an illustration of an assembled cross-sectional view of the strain isolation layer assembly 50b of FIG. 5A. As shown in FIG. 5A, the strain isolation layer assembly 50b comprises the underlying substrate layer 52 having the first surface 54 and the second surface 56. The second surface 56 of the underlying substrate layer 52 is preferably coupled or bonded to the strain isolation layer 30 with the first bonding element layer 66a, preferably in the form of adhesive 68. The strain isolation layer 30 comprises the first surface 58 and the second surface 60. The second surface 60 of the strain isolation layer 30 is preferably coupled or bonded to the added layer 70 with the second bonding element layer 66b, preferably in the form of adhesive 68. The added layer 70 comprises a first surface 72 and a second surface 74. The second surface 74 of the added layer 70 is preferably coupled or bonded to the rigid solar layer 12 having the first surface 62 and the second surface 64 via a third bonding element layer 66c, preferably in the form of adhesive 68.

Figure 5C:
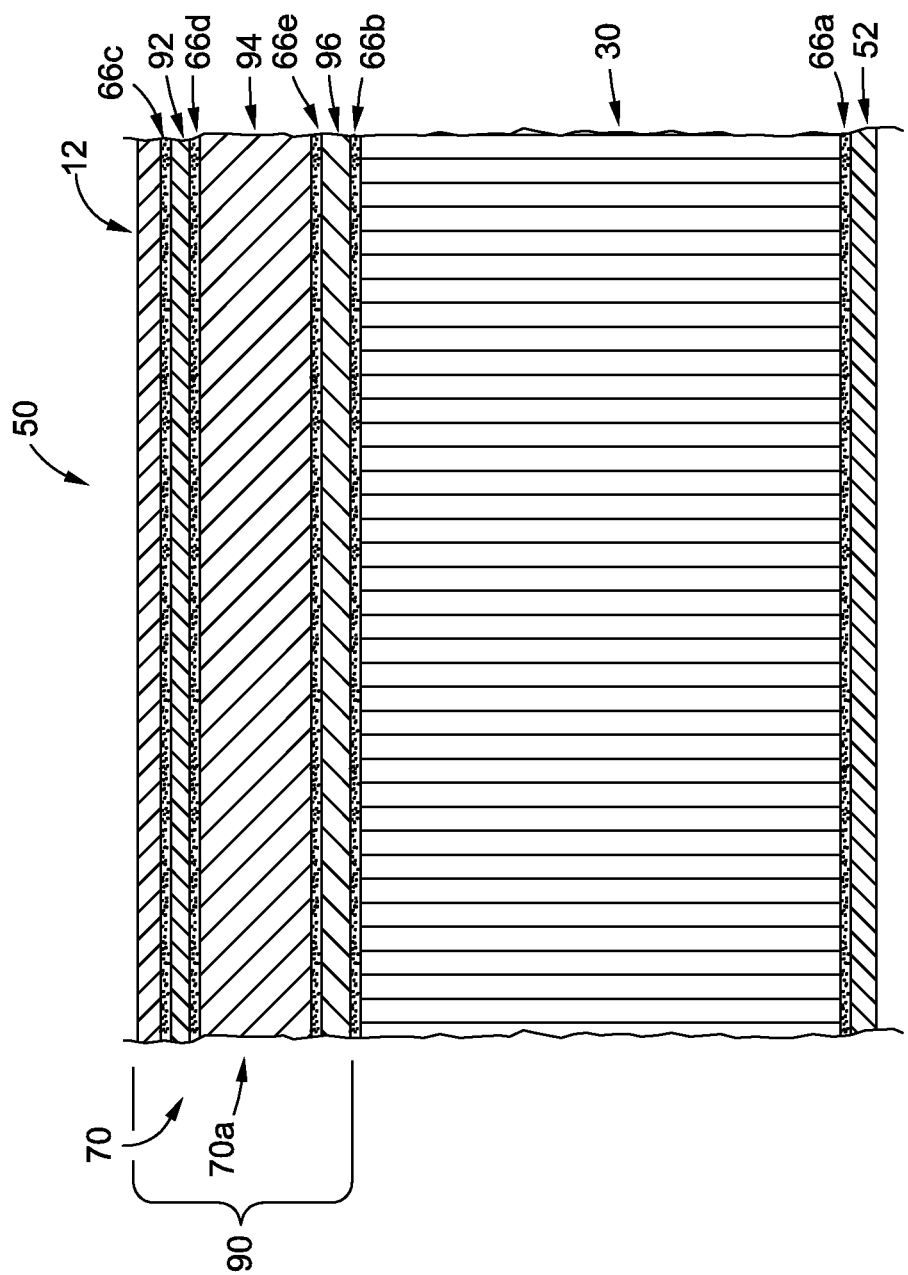
FIG. 5C is an illustration of one of the embodiments of an added layer attached to a rigid solar layer and a strain isolation layer.
Figure 5D:
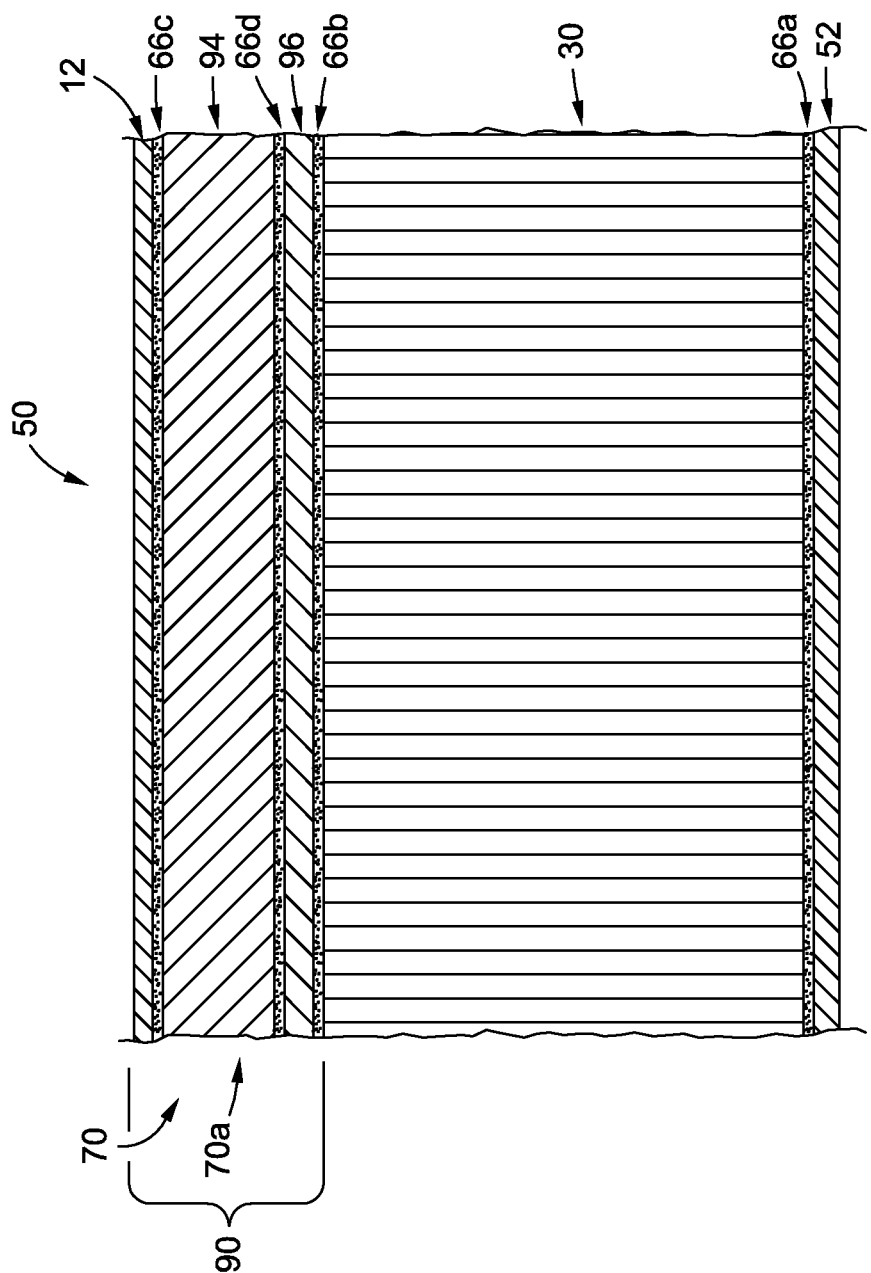
FIG. 5D is an illustration of another one of the embodiments of an added layer attached to a rigid solar layer and a strain isolation layer.

The added layer 70 may comprise various embodiments. FIG. 5C is an illustration of one of the embodiments of an added layer 70a attached to rigid solar layer 12 and strain isolation layer 30. FIG. 5D is an illustration of another one of the embodiments of an added layer 70b attached to rigid solar layer 12 and strain isolation layer 30. As shown in FIGS. 5C-5D, embodiments of the strain isolation layer assembly 50 comprise a sandwich structure 90 comprising the added layers 70a, 70b, respectively, attached to solar layer 12. Each added layer 70a, 70b comprises a core layer 94 that is lightweight and one or more first and second facesheet layers 92, 96, respectively. Preferably, the added layer 70 has a thickness of about 0.005 inch to about 0.010 inch. The added layer 70a, as shown in FIG. 5C and in FIG. 6, comprises the core layer 94 mounted in between the first facesheet layer 92 and the second facesheet layer 96. The first facesheet layer 92 is coupled or mounted above the core layer 94 via a fourth bonding element layer 66d, and the second facesheet layer 96 is coupled or mounted below the core layer 94 via a fifth bonding element layer 66e. The first facesheet layer 92 may be coupled or bonded to the rigid solar layer 12 via the third bonding element layer 66c. The second facesheet layer 96 is preferably coupled to the strain isolation layer 30 (see FIG. 6) via the second bonding element layer 66b. The first, second, third, fourth, and fifth bonding element layers 66a, 66b, 66c, 66d, 66e are preferably in the form of adhesive 68 (see FIG. 6). However, other suitable bonding element layers may also be used. The added layer 70b, as shown in FIG. 5D and in FIG. 10, comprises the core layer 94 and one facesheet layer in the form of second facesheet layer 96 coupled or mounted below the core layer 94 via the fourth bonding element layer 66d. The core layer 94 may be coupled or bonded directly to the rigid solar layer 12 via the third bonding element layer 66c. In this embodiment, the rigid solar layer 12 acts as the first facesheet layer 92. The second facesheet layer 96 is preferably coupled to the strain isolation layer 30 (see FIG. 10) via the second bonding element layer 66b. The third and fourth bonding element layers 66c, 66d are preferably in the form of adhesive 68 (see FIG. 6), and the first and second bonding element layers 66a, 66b are preferably in the form of flexible glue portions 133 (see FIG. 10). However, other suitable bonding element layers may also be used.

In one embodiment, as shown in FIGS. 5A-5B, the added layer 70 may be coupled between the separate rigid solar layer 12 and the strain isolation layer 30. In another embodiment, as shown in FIGS. 5C-5D, the added layer may be first coupled or bonded to the rigid solar layer 12 to form the sandwich structure 90, and the sandwich structure 90 may then be coupled or bonded to the strain isolation layer 30 (see FIGS. 6, 10). The core layer 94 of the added layer 70 may comprise a composite material such as polymethacrylimide (PMI) based structural foam, e.g., ROHACELL (ROHACELL is a registered trademark of Evonik Roehm GMBH of Germany), styrene foam, polyvinyl chloride (PVC) foam, urethane foam, polypropylene foam, polyimide foam, acrylic foam, carbon fiber reinforced plastics, aramid fiber reinforced plastics, polymer matrix composite material, polyurethanes, or other suitable composite materials. Alternatively, the core layer 94 of the added layer 70 may comprise a thermoplastic honeycomb sandwich core. Alternatively, the core layer 94 of the added layer 70 may comprise a metal material such as aluminum, titanium, steel, alloys thereof, or other suitable metals. The first and second facesheet layers 92, 96, respectively, may comprise facesheets made of a thermoplastic material such as one or more of carbon fiber composite material, polymer material, carbon fiber reinforced polypheylene sulfide (PPS), carbon fiber reinforced polyetheretherketone (PEEK), carbon fiber reinforced polyetherketoneketone (PEKK), carbon fiber reinforced polyethyleneimine (PEI), or another suitable thermoplastic material. Alternatively, the added layer 70 may further comprise another suitable rigid material to provide reinforcement to the rigid solar layer 12. The depth and density of the core layer 94 and the first and second facesheet layers 92, 96 are chosen to provide enough rigidity to the rigid solar layer 12 such that buckling and wrinkling of the rigid solar layer 12 are prevented or minimized. Bonding the rigid solar layer 12 to the added layer 70, which is preferably lightweight, increases the vertical or out-of-plane rigidity or stiffness of the rigid solar layer 12. Further, use of the added layer 70 in the strain isolation layer assembly 50 may reduce the horizontal shear flexibility or compliance in the in-plane direction required by the strain isolation layer 30.

The strain isolation layer 30, or strain isolation layers 30a-30g (see FIGS. 4A-13C) may comprise various different embodiments.

Figure 6:
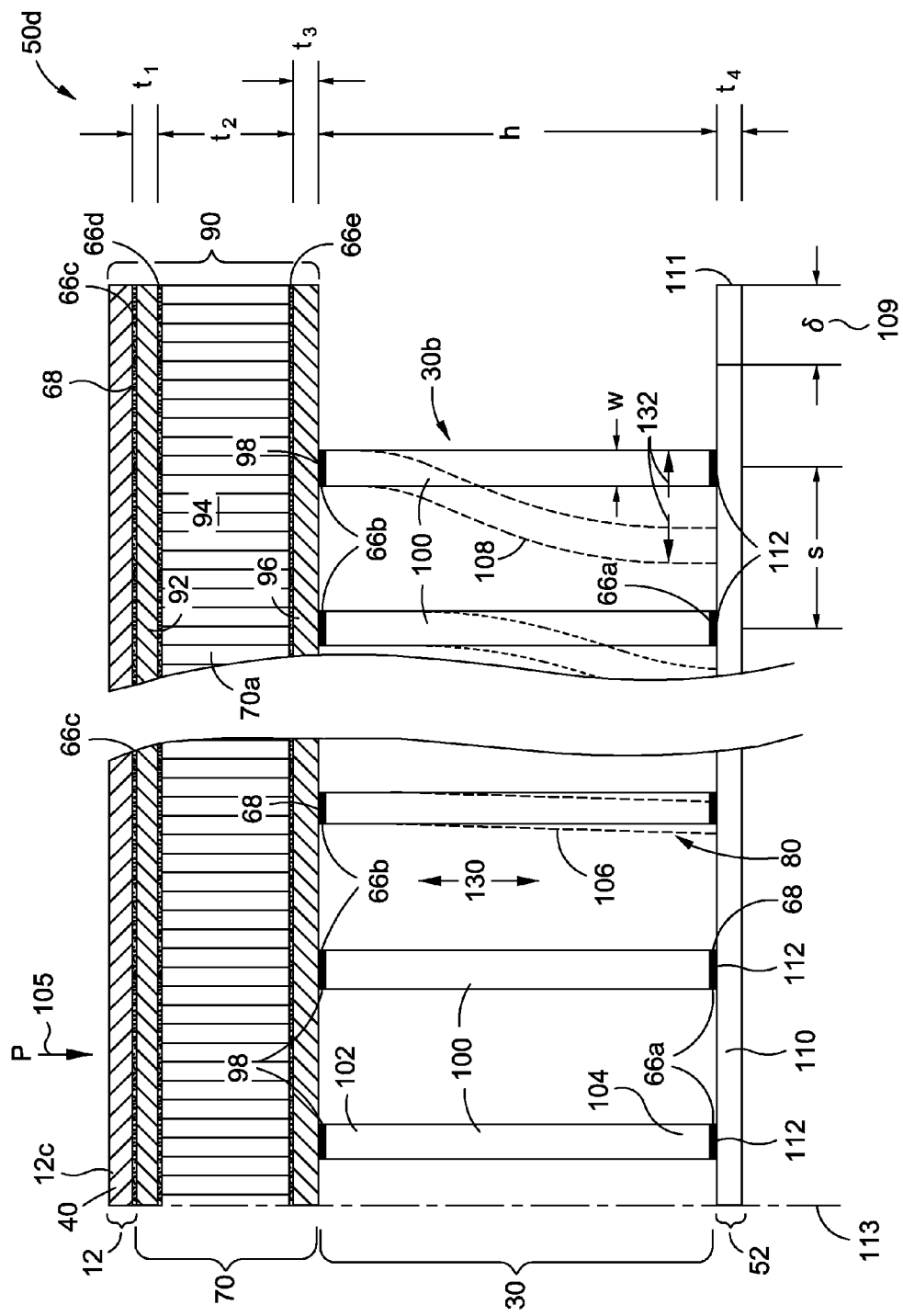
FIG. 6 is an illustration of a cross-sectional view of another one of the embodiments of a strain isolation layer assembly of the disclosure with a column support strain isolation layer.

FIG. 6 is an illustration of a cross-sectional view of another one of the embodiments of the strain isolation layer assembly 50, in the form of strain isolation layer assembly 50d comprising the rigid solar layer 12, the added layer 70, the strain isolation layer 30, and the underlying substrate layer 52. As shown in FIG. 6, in another embodiment, the strain isolation layer 30 may comprise a column support strain isolation layer 30b. The column support strain isolation layer 30b preferably comprises a plurality of vertical column supports 100 each having a first end 102, a second end 104, a height h, and a width w. Spacing (s) is shown between two vertical column supports 100 and is preferably about 0.2 inch or less but not to zero. The width (w) of each vertical column support 100 may preferably be in a range of from about 0.004 inch to about 0.010 inch. The vertical column supports 100 preferably comprise a flexible foam material such as foams made of one or more of silicone, polyurethane, melamine, polyvinyl fluoride (PVF), polyvinyl chloride (PVC), urethane, vinyl, polyethylene, acrylic, polyester, polypropylene, polyethylene, polyimide, or another suitable flexible foam material.

The column support strain isolation layer 30b has a discontinuous configuration 80. The column support strain isolation layer 30b has a vertical rigidity 130 and a horizontal shear flexibility 132. The vertical column supports 100 provide very rigid vertical support while being compliant in the horizontal directions. Compliance can be controlled by adjustments to the column height (h) or length and width (w) or diameter. As shown in FIG. 6, when a strain is applied to the underlying substrate layer 52, a shear deflection (δ) 109 results at an end 111 of the underlying substrate layer 52. Near a centerline 113 of the strain isolation layer assembly 50d, the strain and associated shear deflection (δ) 109 are small or substantially zero. Thus, the vertical column supports 100 near the end 111 of the underlying substrate layer 52 will bend with an S-shaped deflection 108 and exhibit horizontal shear flexibility 132. Such vertical column supports 100 near the end 111 of the underlying substrate layer 52 will bend more than the vertical column supports 100 bending with a slight deflection 106 or the vertical column supports 100 near the centerline 113 of the strain isolation layer assembly 50d.

As further shown in FIG. 6, the column support strain isolation layer 30b is preferably coupled or bonded between the underlying substrate layer 52, which may be in the form of an aircraft wing skin 110, and the upper rigid solar layer 12, which may be in the form of a solar cell layer 12c comprised of a plurality of solar cells 40. The first end 102 of each vertical column support 100 is mounted to portions 98 (see FIG. 6) on the added layer 70 via second bonding element layers 66b, preferably in the form of adhesive 68. As shown in FIG. 6, the sandwich structure 90 comprises the added layer 70 bonded to the rigid solar layer 12. The added layer 70 is in the form of added layer 70a comprising the core layer 94 in between the first and second facesheet layers 92, 96, respectively. The first facesheet layer 92 has a thickness $t_1$. The core layer 94 has a thickness $t_2$. The second facesheet layer 96 has a thickness $t_3$. The rigid solar layer 12 is bonded or coupled to the first facesheet layer 92 of the added layer 70a via the third bonding element layer 66c. The second end 104 of each vertical column support 100 is mounted to portions 112 (see FIG. 6) on the underlying substrate layer 52 via first bonding element layers 66a, preferably in the form of adhesive 68. The underlying substrate layer 52 has a thickness $t_4$. Preferably, the adhesive 68 bonding the first end 102 and the second end 104 of each vertical column support 100 to the added layer 70 and the underlying substrate layer 52, respectively, has a strength of between about 250 psi (pounds per square inch) to about 1000 psi.

Compliance in the horizontal plane tends to decouple the relative compressive, tensile, and thermal strains between the rigid solar layer 12 from the underlying substrate layer 52. With this embodiment of the strain isolation layer assembly 50d, the column support strain isolation layer 30b is able to support the rigid solar layer 12 with a plurality of vertical column supports 100 having small widths or diameters to make the column support strain isolation layer 30b more compliant or flexible.

Figure 7:
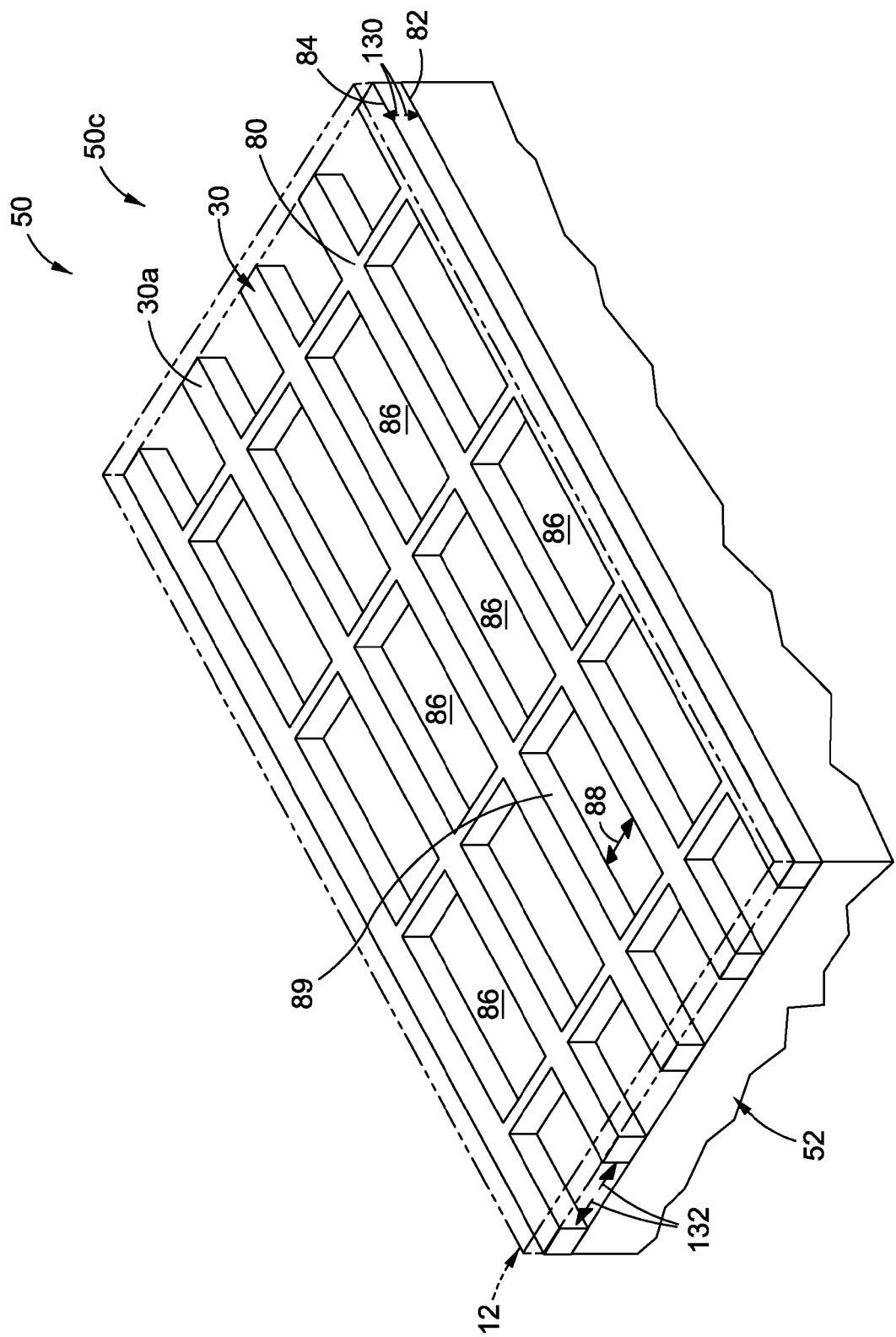
FIG. 7 is an illustration of a top perspective view of another one of the embodiments of a strain isolation layer assembly of the disclosure with a perforated foam strain isolation layer.

FIG. 7 is an illustration of a top perspective view of another one of the embodiments of the strain isolation layer assembly 50, in the form of strain isolation layer assembly 50c comprising the rigid solar layer 12, the strain isolation layer 30, and the underlying substrate layer 52. As shown in FIG. 7, in one embodiment, the strain isolation layer 30 may comprise a perforated foam strain isolation layer 30a. The perforated foam strain isolation layer 30a has a first surface 82 and a second surface 84. As further shown in FIG. 7, the perforated foam strain isolation layer 30a is preferably coupled or bonded between the underlying substrate layer 52 and the upper rigid solar layer 12. The first surface 82 of the perforated foam strain isolation layer 30a is mounted on the underlying substrate layer 52. The rigid solar layer 12 is mounted on the second surface 84 of the perforated foam strain isolation layer 30a. The perforated foam strain isolation layer 30a further has a discontinuous configuration 80 with a plurality of perforations 86.

The perforated foam strain isolation layer 30a may comprise a perforated double-stick foam tape, such as obtained from 3M Company of St. Paul, Minn., or another suitable perforated foam tape. The perforations 86 of the perforated foam strain isolation layer 30a preferably increases horizontal shear flexibility or in-plane compliance while maintaining sufficient vertical rigidity or out-of-plane rigidity in order to effectively position the rigid solar layer 12 relative to the underlying substrate layer 52. Compliance in the horizontal plane tends to decouple the relative structural and thermal strains between the rigid solar layer 12 from the underlying substrate layer 52. With the perforations 86, orientation of remaining thin walls 89 (see FIG. 7) of the perforated foam strain isolation layer 30a controls flexibility or compliance. The perforated foam strain isolation layer 30a has a vertical rigidity 130 and a horizontal shear flexibility 132. The flexure of the thin walls 89 is much easier in a perpendicular direction 88 (see FIG. 7) to the thin walls 89, and the perforated foam strain isolation layer 30a is more compliant in such perpendicular direction 88. With this embodiment of the strain isolation layer assembly 50c having the perforated foam strain isolation layer 30a, the perforated foam strain isolation layer 30a directionally controls flexibility or compliance and the perforations 86 reduce the weight of the perforated foam strain isolation layer 30a.

Figure 8A:
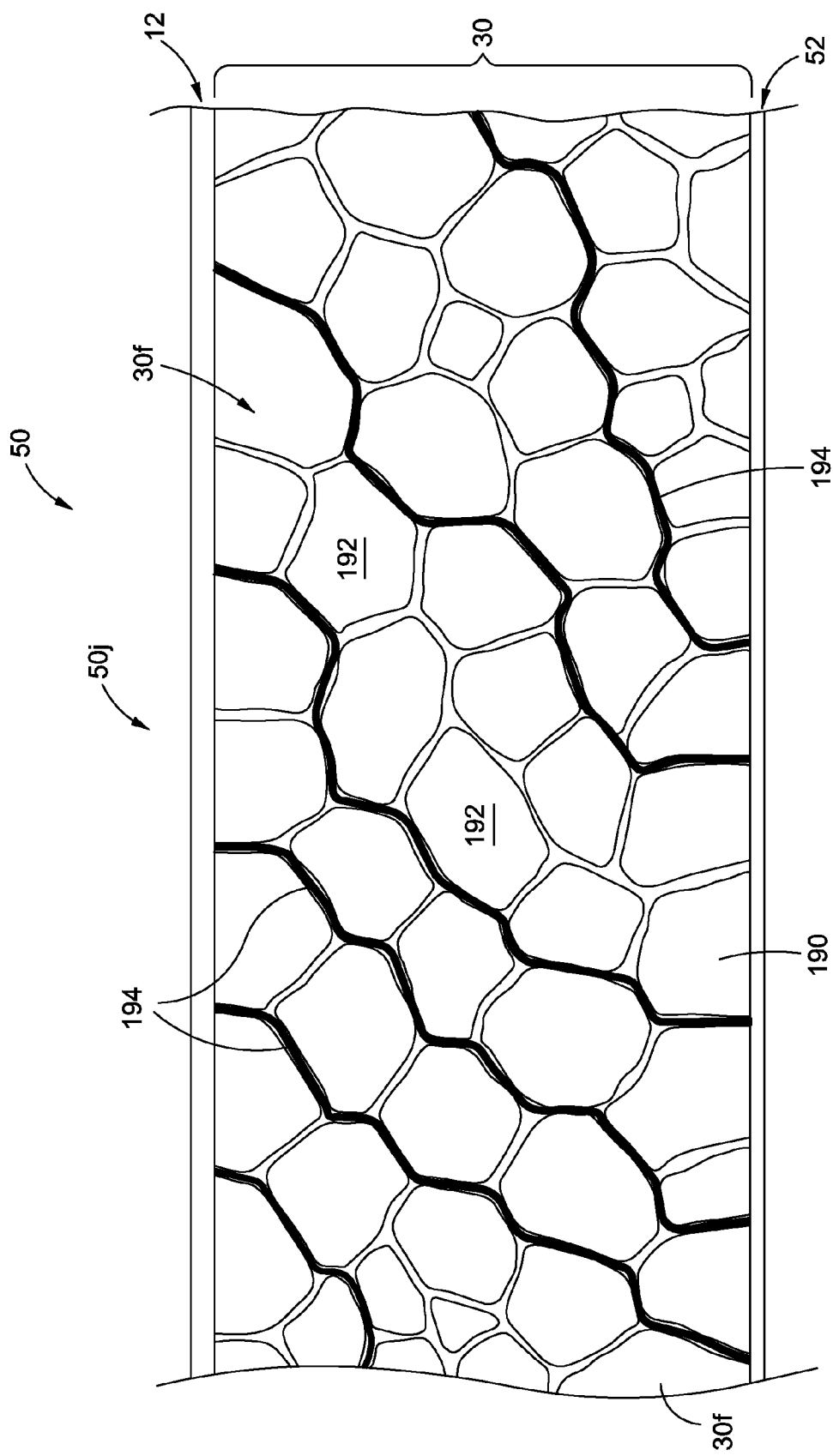
FIG. 8A is an illustration of a cross-sectional view of another one of the embodiments of a strain isolation layer assembly of the disclosure showing foam cell walls of one of the embodiments of a foam strain isolation layer.
Figure 8B:
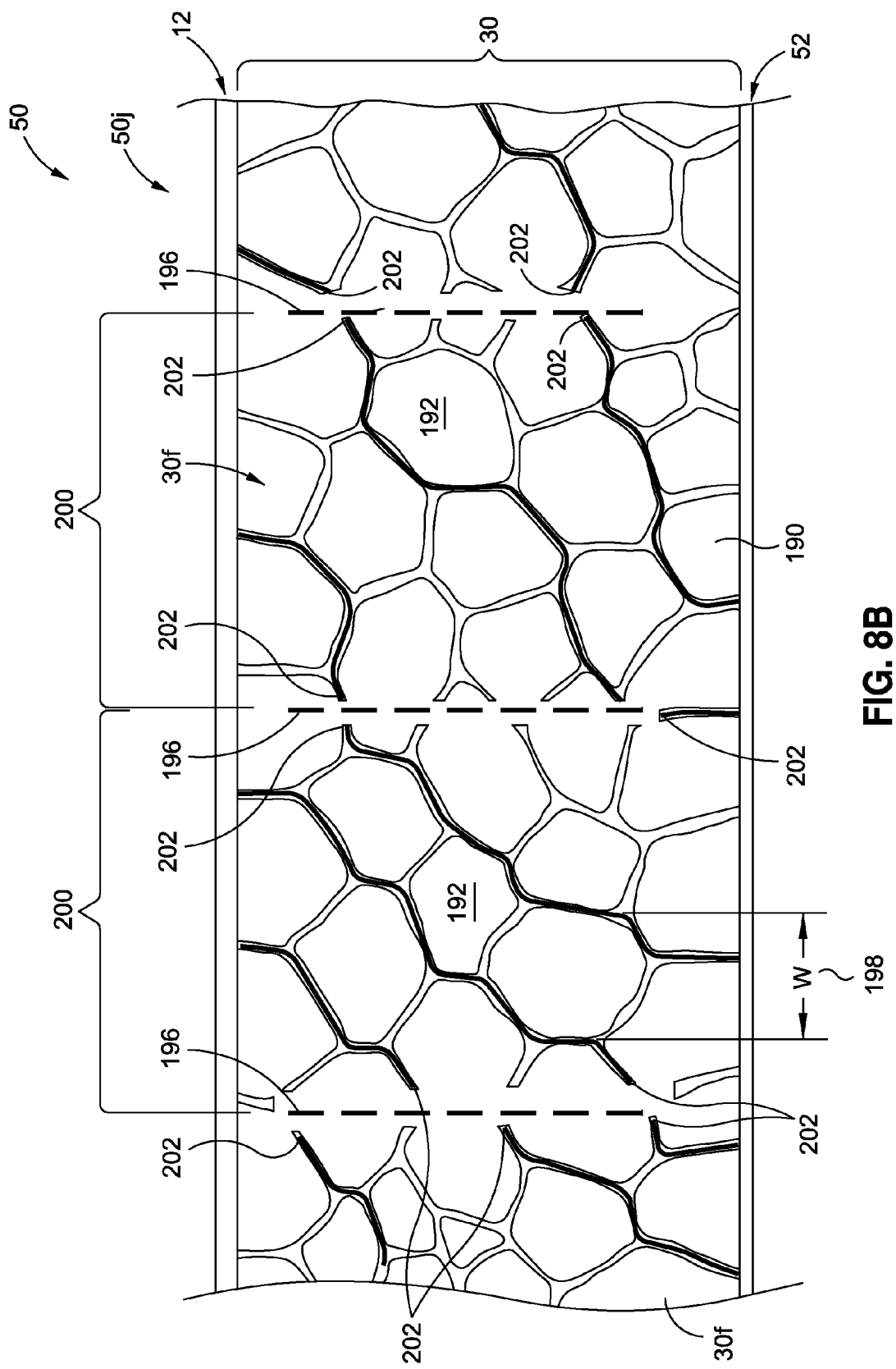
FIG. 8B is an illustration of a cross-sectional view of the foam strain isolation layer assembly of FIG. 8A showing vertical slits through the foam strain isolation layer and certain foam cell walls no longer effective for shear.
Figure 8C:
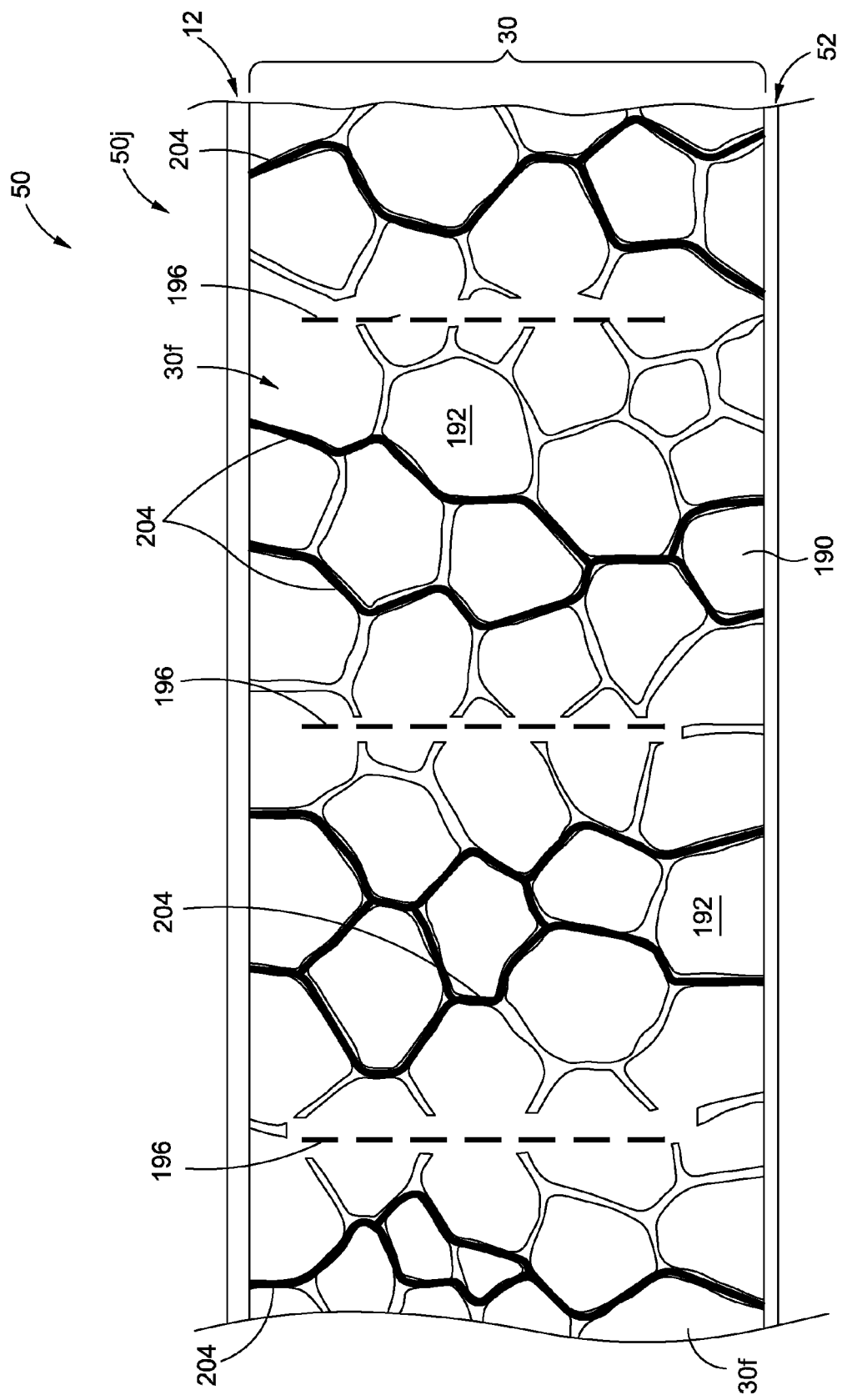
FIG. 8C is an illustration of a cross-sectional view of the foam strain isolation layer assembly of FIG. 8A showing vertical slits through the foam strain isolation layer and certain foam cell walls still effective for vertical stiffness.

FIGS. 8A-8C show another one of the embodiments of a strain isolation layer assembly 50, in the form of strain isolation layer assembly 50j, comprising the rigid solar layer 12, the strain isolation layer 30, and the underlying substrate layer 52. FIG. 8A is an illustration of a cross-sectional view of strain isolation layer assembly 50j showing the sliced foam strain isolation layer 30f prior to being sliced. The sliced foam strain isolation layer 30f comprises an open cell foam 190 having a plurality of foam cells 192 and foam cell walls 194. The open cell foam 190 may have a height or thickness of about 0.10 inch to about 1.0 inch. The foam cells 192 may have a cell width (W) 198 of about 0.060 inch (see FIG. 8B). The foam cell walls 194 in dark lines indicate foam cell walls 194 effective for shear motion.

FIG. 8B is an illustration of a cross-sectional view of the foam strain isolation layer assembly 50j of FIG. 8A showing a plurality of vertical slits 196 cut through the sliced foam strain isolation layer 30f. Each vertical slit 196 may preferably extend the entire thickness of the sliced foam isolation layer 30f, although it may be somewhat less than the entire thickness if manufacturing concerns dictate that the vertical slit 196 not extend all the way through the entire thickness. A vertical slit spacing 200 between vertical slits 196 that are adjacent to each other is preferably some small multiple of the size of the foam cells 192 As a result of cutting the vertical slits 196 through the sliced foam strain isolation layer 30f, the sliced foam strain isolation layer 30f has certain sliced walls 202 no longer effective for shear motion.

FIG. 8C is an illustration of a cross-sectional view of the foam strain isolation layer assembly 50j of FIG. 8A showing the vertical slits 196 through the sliced foam strain isolation layer 30f. FIG. 8C further shows certain intact walls 204 still effective for vertical stiffness or tension.

Figure 9A:
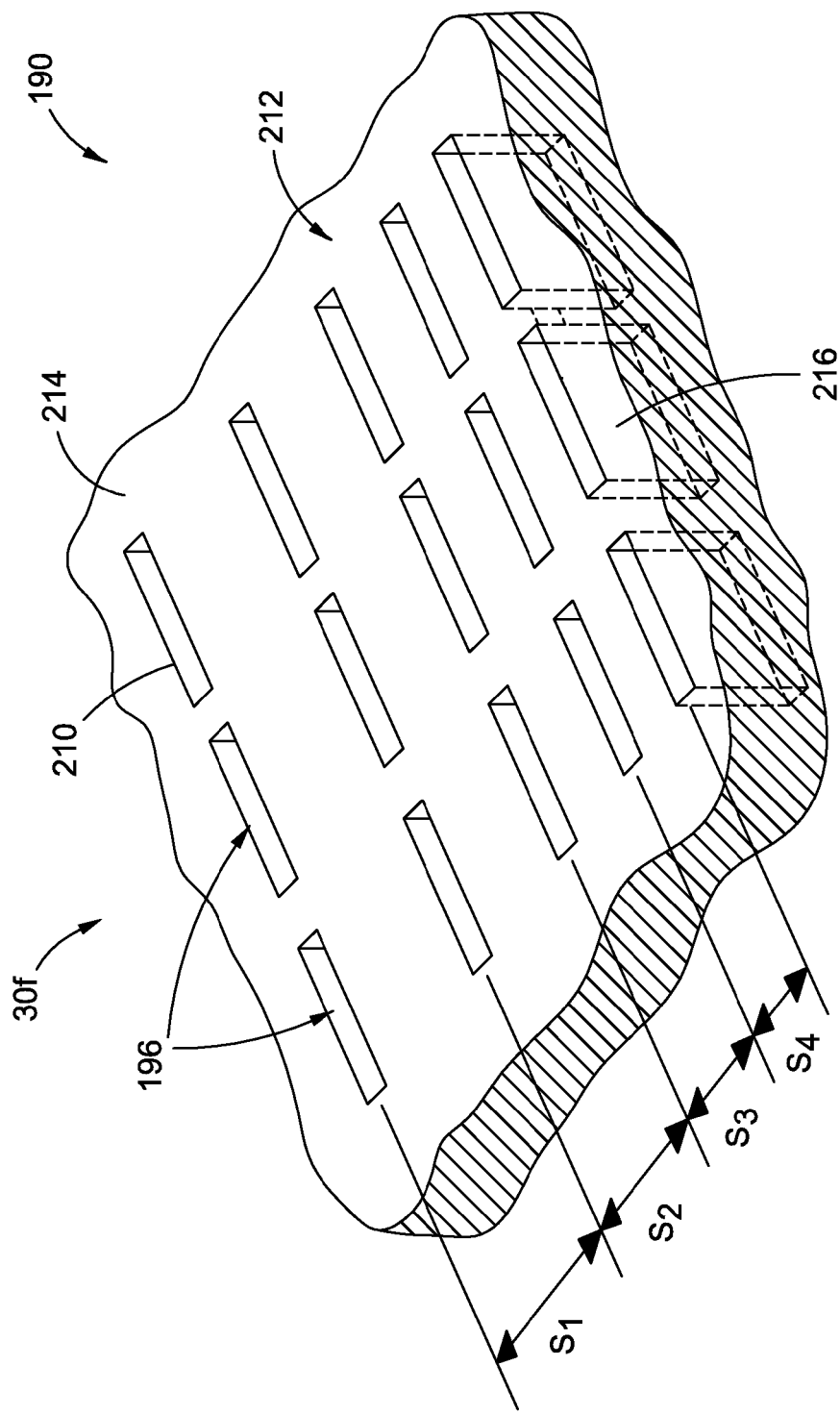
FIG. 9A is an illustration of a perspective view of a top portion of one of the embodiments of a foam strain isolation layer with one of the embodiments of a vertical slit geometry.
Figure 9B:
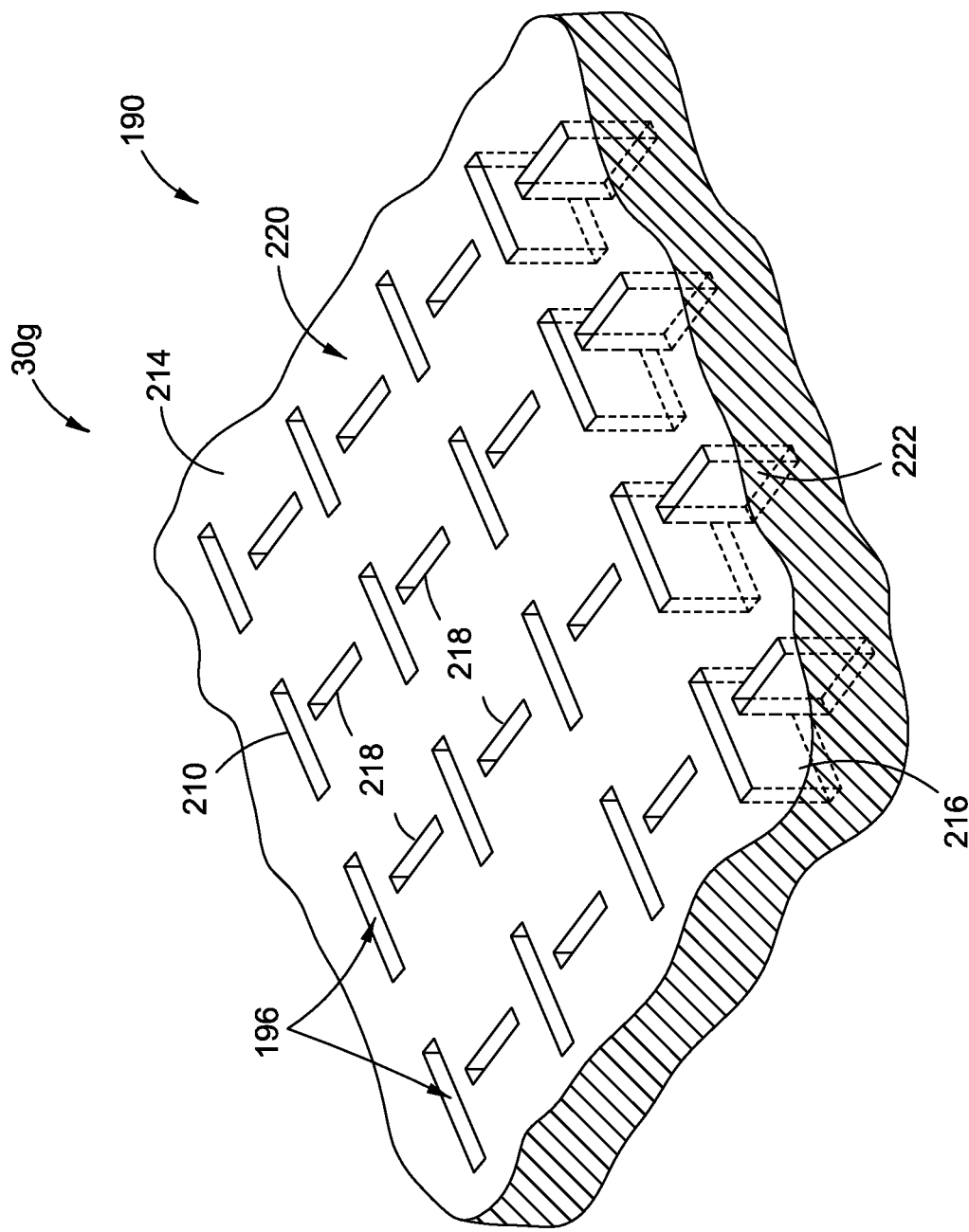
FIG. 9B is an illustration of a perspective view of a top portion of another one of the embodiments of a foam strain isolation layer with another one of the embodiments of a vertical slit geometry.

FIGS. 9A-9B show alternate views of top portions 214 of the sliced foam strain isolation layer 30f having various vertical slit geometries. FIG. 9A is an illustration of a perspective view of a top portion 214 of one of the embodiments of the sliced foam strain isolation layer 30f with one of the embodiments of a vertical slit geometry 212. FIG. 9A shows the top portion 214 of the open cell foam 190 with a plurality of vertical slits 196 having a rectangular configuration 210. Each vertical slit 196 extends through a first internal length portion 216 of the sliced foam strain isolation layer 30f. Spacing $S_1$, $S_2$, $S_3$, $S_4$ between the vertical slits 196 may be constant or variable. Larger spacing may be appropriate near the center of the panel, where the differences in horizontal deflections are not as large as they are at the ends or edges.

FIG. 9B is an illustration of a perspective view of a top portion 214 of another one of the embodiments of a foam strain isolation layer 30g with another one of the embodiments of a vertical slit geometry 220. FIG. 9B shows the top portion 214 of the open cell foam 190 with the vertical slit geometry 220 having the plurality of vertical slits 196 having the rectangular configuration 210. Each vertical slit 196 extends through the first internal length portion 216 of the sliced foam strain isolation layer 30f. In addition, the vertical slit geometry 220 has a plurality of perpendicular vertical slits 218 perpendicular to the vertical slits 196. Each perpendicular vertical slit 218 extends through a second internal length portion 222 of the sliced foam strain isolation layer 30f. Alternatively, the sliced foam strain isolation layer may have other vertical slit geometries such as zig-zag vertical slits (not shown), triangular vertical slits (not shown), or other suitable vertical slit geometries.

Figure 10:
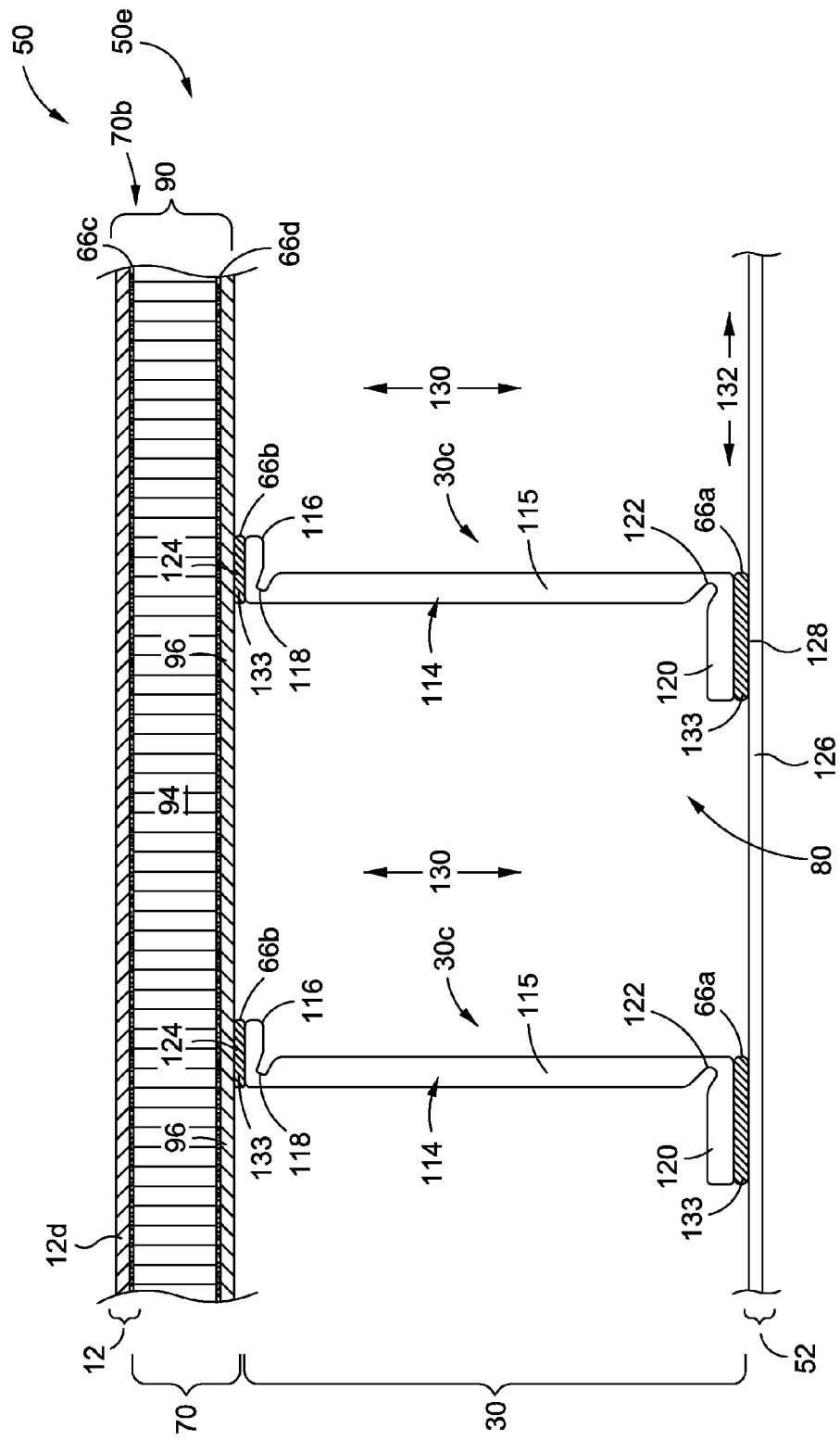
FIG. 10 is an illustration of a front view of another one of the embodiments of a strain isolation layer assembly of the disclosure with a hinged support strain isolation layer.

FIG. 10 is an illustration of a front view of another one of the embodiments of a strain isolation layer assembly 50, in the form of strain isolation layer assembly 50e comprising the rigid solar layer 12, the added layer 70, the strain isolation layer 30, and the underlying substrate layer 52. As shown in FIG. 10, in another embodiment, the strain isolation layer 30 may comprise a hinged support strain isolation layer 30c. The hinged support strain isolation layer 30c preferably comprises a plurality of vertical hinged supports 114. Each of the vertical hinged supports 114 may comprise an elongated column body 115, a first bent tab end 116 with a first hinged portion 118, and a second bent tab end 120 with a second hinged portion 122. The first hinged portion 118 and the second hinged portion 122 have a reduced flexural rigidity. The orientation and configuration of the first hinged portion 118 and the second hinged portion 122 is such that the primary strain direction is accommodated. Other directions in which the relative movement between the rigid solar layer 12 and underlying substrate layer 52 is reduced are accommodated by flexure of the elongated column body 115 itself. The vertical hinged supports 114 preferably comprise a relatively stiff or rigid material such as carbon composite, plastic, or another suitable relatively stiff or rigid material.

The hinged support strain isolation layer 30c has a discontinuous configuration 80. The hinged support strain isolation layer 30c has a vertical rigidity 130 and a horizontal shear flexibility 132. The elongated column body 115 is preferably thin and stiff in order to easily support vertical loads and provide the vertical rigidity 130. The first hinged portion 118 and the second hinged portion 122 are flexible and provide the horizontal shear flexibility 132.

As further shown in FIG. 10, the hinged support strain isolation layer 30c is preferably coupled or bonded between the underlying substrate layer 52 and the rigid solar layer 12. In this embodiment, the underlying substrate layer 52 may comprise a polyvinyl fluoride (PVF) substrate 126, and the rigid solar layer 12 may comprise a polyethylene terephthalate (PET)/fluoropolymer film/solar cell layer 12d. The first bent tab end 116 of each vertical hinged support 114 is preferably mounted to portions 124 (see FIG. 10) on the added layer 70 via second bonding element layers 66b, preferably in the form of flexible glue portions 133. As shown in FIG. 10, the sandwich structure 90 comprises the added layer 70 bonded to the rigid solar layer 12. The added layer 70 is in the form of added layer 70b comprising sandwich structure 90 having the core layer 94 mounted to the second facesheet layer 96. The rigid solar layer 12 is bonded or coupled to the core layer 94 of the added layer 70b via the third bonding element layer 66c. The second bent tab end 120 of each vertical hinged support 114 is preferably mounted to portions 128 (see FIG. 10) on the underlying substrate layer 52 via first bonding element layers 66a, preferably in the form of flexible glue portions 133.

Figure 11A:
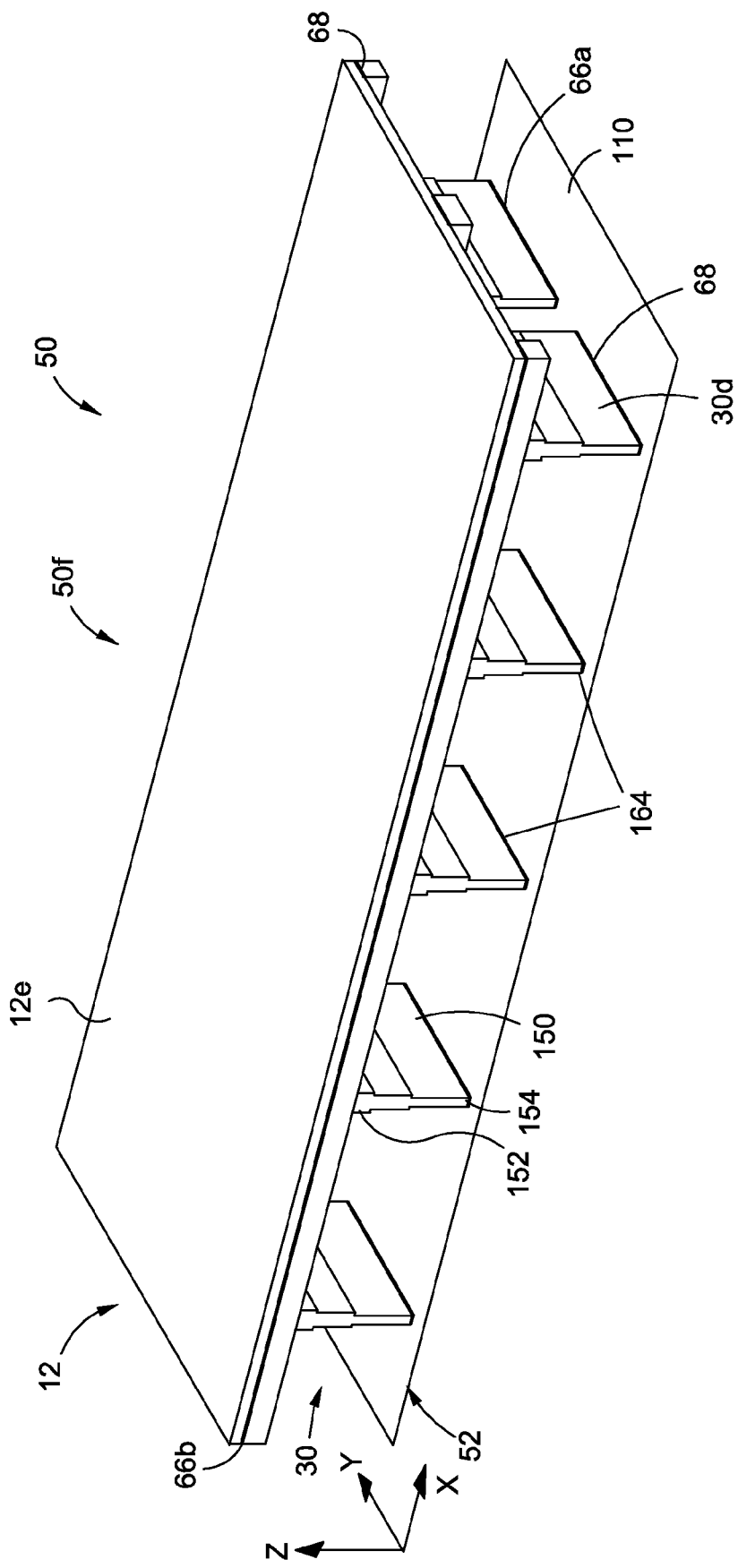
FIG. 11A is an illustration of a front perspective view of another one of the embodiments of a strain isolation layer assembly of the disclosure with a foam blade support strain isolation layer.
Figure 11B:
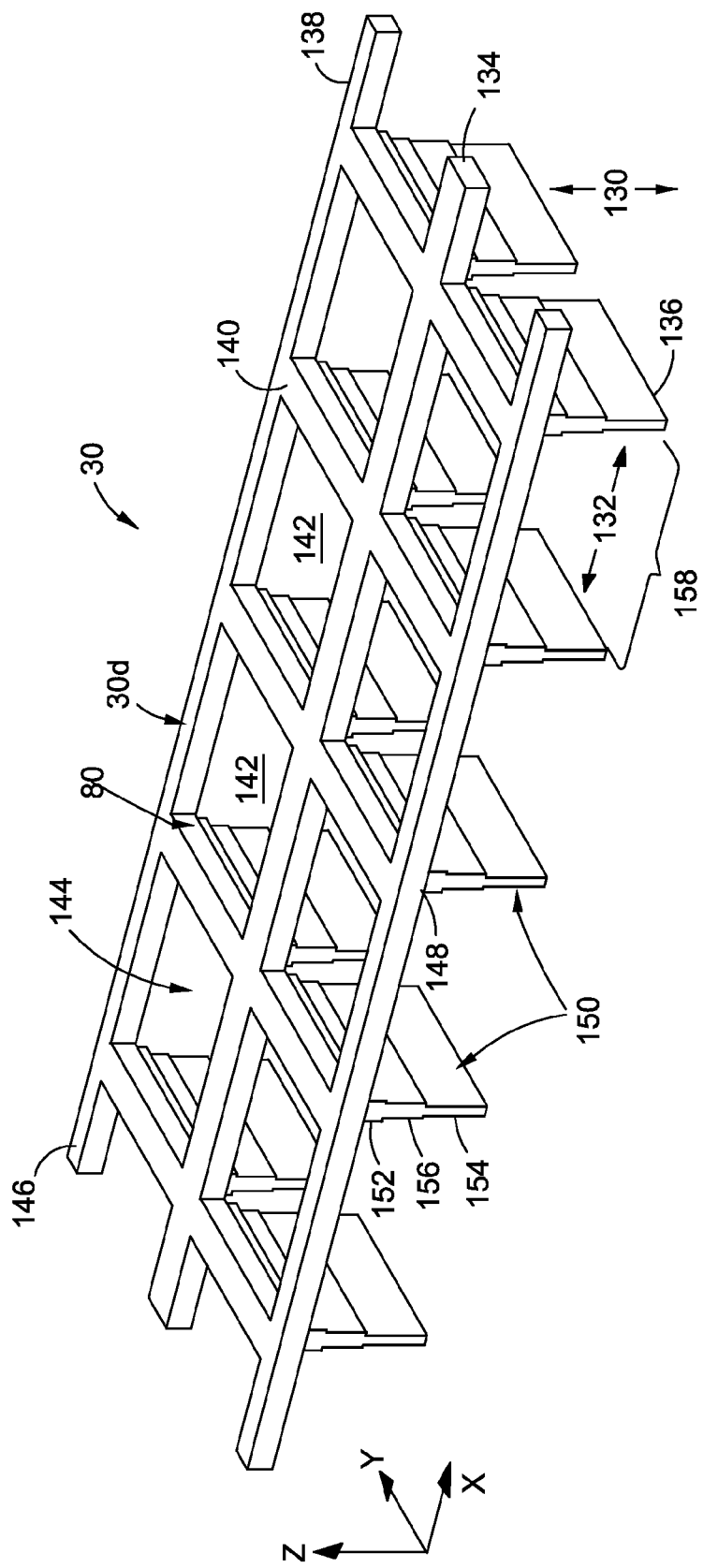
FIG. 11B is an illustration of a front perspective view of the foam portion of the foam blade support strain isolation layer of FIG. 11A.

FIGS. 11A-11F show another one of the embodiments of a strain isolation layer assembly 50, in the form of strain isolation layer assembly 50f comprising the rigid solar layer 12, the strain isolation layer 30, and the underlying substrate layer 52. As shown in FIGS. 11A-11F, in another embodiment, the strain isolation layer 30 may comprise a foam blade support strain isolation layer 30d. FIG. 11A is an illustration of a front perspective view of the strain isolation layer assembly 50, in the form of strain isolation layer assembly 50f. FIG. 11B is an illustration of a front perspective view of the foam portion of the foam blade support strain isolation layer 30d of FIG. 11A.

As shown in FIG. 11B, the foam blade support strain isolation layer 30d has a first surface 136 and a second surface 138. The foam blade support strain isolation layer 30d further comprises a foam blade support portion 134 having a plurality of widthwise portions 140 interconnected to a plurality of lengthwise portions 146 that are substantially perpendicular to the widthwise portions 140, and a plurality of openings 142. The foam blade support portion 134 preferably comprises a substantially rectangular grid pattern 144. The foam blade support strain isolation layer 30d further comprises a plurality of foam blades 150 extending from portions 148 of the foam blade support portion 134 in only one direction. This provides flexible compliance in the lengthwise or horizontal direction and rigid compliance in the widthwise and vertical directions. The foam blades 150 each have a first end 152, a second end 154, and a body portion 156. The foam blades 150 are preferably spaced evenly apart from one another via a spacing 158. The spacing 158 between foam blades 150 that are adjacent to each other may be about 0.2 inch or less but not to zero. The foam blade support strain isolation layer 30d preferably comprises a flexible foam material such as foams made of one or more of silicone, polyurethane, melamine, polyvinyl fluoride (PVF), polyvinyl chloride (PVC), urethane, vinyl, polyethylene, acrylic, polyester, polypropylene, polyethylene, polyimide, melamine, plastic, or another suitable flexible foam material.

As shown in FIG. 11B, the foam blade support strain isolation layer 30d preferably has a unitary, one-piece construction which is advantageous for ease of assembly and manufacture. The foam blade support strain isolation layer 30d has a discontinuous configuration 80 with the substantially rectangular grid pattern 144. Further, the foam blade support strain isolation layer 30d has a vertical rigidity 130 and a horizontal shear flexibility 132. The configuration of the foam blade support strain isolation layer 30d is preferably tailored to provide vertical support to the rigid solar layer 12 while providing flexibility and compliance in the horizontal direction. The foam blade support strain isolation layer 30d isolates strain in the underlying substrate layer 52 from the thin rigid solar layer 12.

As further shown in FIG. 11A, the foam blade support strain isolation layer 30d is preferably coupled or bonded between the underlying substrate layer 52 and the rigid solar layer 12. In this embodiment, the underlying substrate layer 52 may comprise an aircraft wing skin 110, and the rigid solar layer 12 may comprise a solar panel array 12e. The first surface 136 of the foam blade support strain isolation layer 30d is preferably coupled or bonded to portions 164 (see FIG. 11A) on the underlying substrate layer 52 via first bonding element layers 66a, preferably in the form of adhesive 68. The second surface 138 of the foam blade support strain isolation layer 30d is preferably coupled or bonded to portions 166 of the rigid solar layer 12 via the second bonding element layer 66b, preferably in the form of adhesive 68.

FIG. 11C is an illustration of a front view of the foam blade support strain isolation layer 30d of FIG. 11B. FIG. 11C shows the foam blade support strain isolation layer 30d coupled or bonded between the underlying substrate layer 52 and the rigid solar layer 12. FIG. 11C further shows the spacing 158 between the foam blades 150 and the first end 152, the second end 154, and the body portion 156 of the foam blades 150. The width or diameter of the first end 152 of the foam blade 150 may be in a range of from about 0.01 inch to about 0.05 inch. FIG. 11D is an illustration of a front close-up view of circled portion 11D of FIG. 11C. As shown in FIG. 11D, when pressure load P 105 is applied to the strain isolation layer assembly 50f, the foam blades 150 exhibit a vertical rigidity 130 in an out-of-plane direction $d_1$ 160.

FIG. 11E is an illustration of a front view the foam blade support strain isolation layer 30d of FIG. 11B showing horizontal deflections 168 of the foam blades 150. FIG. 11E shows the foam blade support strain isolation layer 30d coupled or bonded between the underlying substrate layer 52 and the rigid solar layer 12. FIG. 11F is an illustration of a front close-up view of circled portion 11F of FIG. 11E. As shown in FIG. 11F, the foam blades 150 may exhibit horizontal shear flexibility 132 in an in-plane direction $d_2$ 162.

Figure 12:
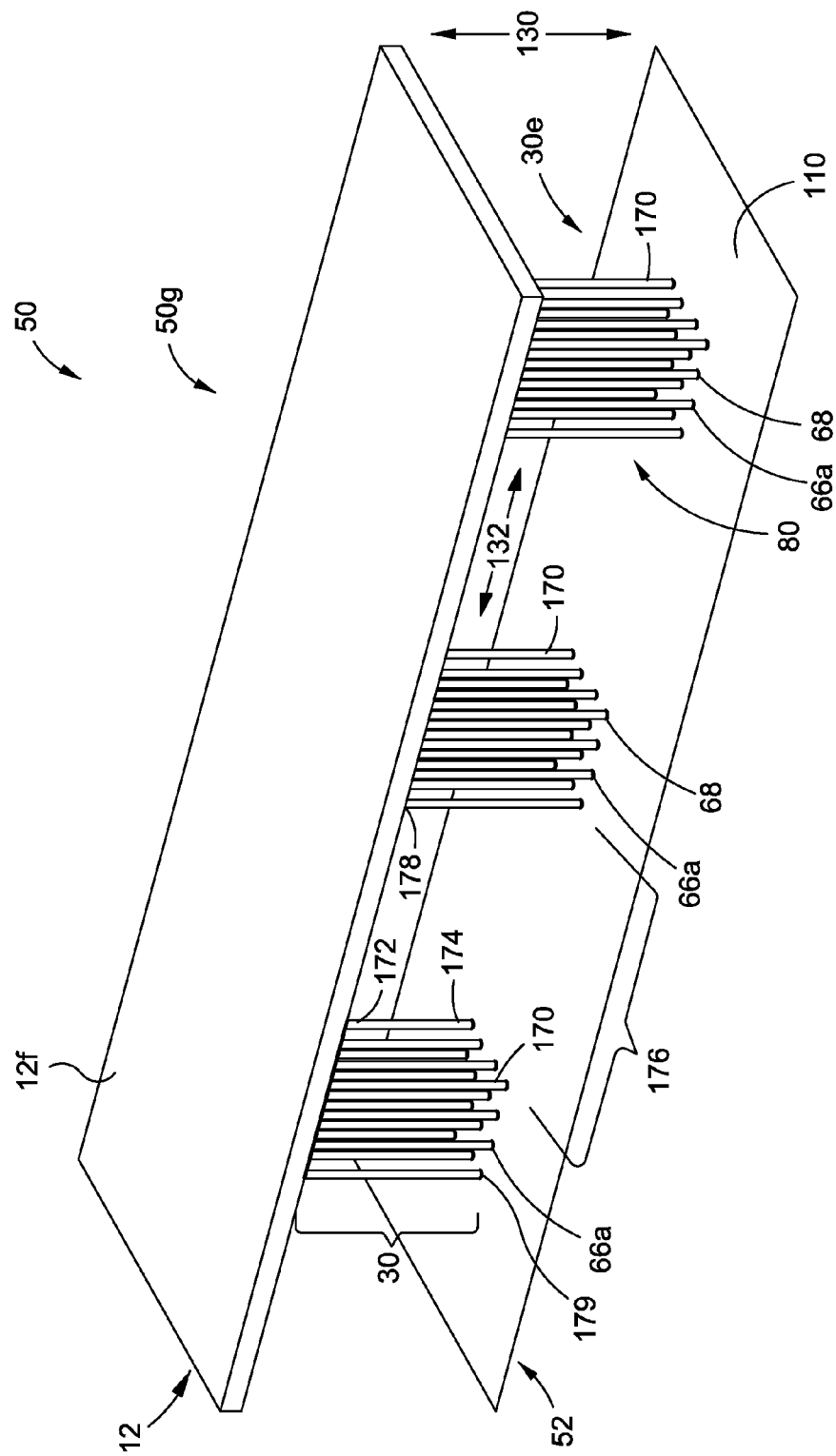
FIG. 12 is an illustration of a front perspective view of another one of the embodiments of a strain isolation layer assembly of the disclosure with a looped fiber support strain isolation layer.

FIG. 12 is an illustration of a front perspective view of a finite element model simulation of another one of the embodiments of a strain isolation layer assembly 50, in the form of strain isolation layer assembly 50g comprising the rigid solar layer 12, the strain isolation layer 30, and the underlying substrate layer 52. As shown in FIG. 12, in another embodiment, the strain isolation layer 30 may comprise a looped fiber strain isolation layer 30e. The looped fiber strain isolation layer 30e preferably comprises a plurality of vertical looped fibers 170 each having a first end 172 and a second end 174. The vertical looped fibers 170 are designed to support the rigid solar layer 12 in the vertical direction but will be flexible in the horizontal or shear direction.

The vertical looped fibers 170 are preferably spaced evenly apart in tufts or groups at a spacing 176. The spacing 176 between adjacent tufts or groups of vertical looped fibers 170 may be about 0.2 inch or less but not to zero. The width of each tuft or group of vertical looped fibers 170 may preferably be in a range of from about 0.004 inch to about 0.010 inch. The width and length of the vertical looped fibers 170 may be controlled to vary flexibility or compliance. The use of widely-spaced tufts or groups of vertical looped fibers 170 may increase horizontal flexibility or compliance while providing sufficiently rigid vertical support to the rigid solar layer 12.

The vertical looped fibers 170 preferably comprise a flexible fiber or fabric material such as polyester, nylon, polytetrafluorethylene (PTFE), or another suitable flexible fiber or fabric material. More preferably, the vertical looped fibers 170 comprise the loop half or portion of a hook and loop material such as a lightweight VELCRO. (VELCRO is a registered trademark of Velcro Industries of the Netherlands.) The loop half or portion may be perforated so that it may have a discontinuous configuration 80 (see FIG. 12).

The looped fiber strain isolation layer 30e preferably has a discontinuous configuration 80. The looped fiber strain isolation layer 30e preferably has a vertical rigidity 130 and a horizontal shear flexibility 132. The vertical looped fibers 170 are preferably thin and stiff in order to easily support vertical loads and provide the vertical rigidity 130. In addition, the vertical looped fibers 170 are preferably sufficiently flexible to provide the horizontal shear flexibility 132 and to reduce stiffness in the shear direction.

As further shown in FIG. 12, the looped fiber strain isolation layer 30e is preferably coupled or bonded between the underlying substrate layer 52 and the rigid solar layer 12. In this embodiment, the underlying substrate layer 52 may comprise an aircraft wing skin 110, and the rigid solar layer 12 may comprise a solar panel array 12f. The first end 172 of each vertical looped fiber 170 preferably coupled or bonded to portions 178 on the rigid solar layer 12 via second bonding element layers 66b, preferably in the form of adhesive 68. The second end 174 of each vertical looped fiber 170 is preferably coupled or bonded to portions 179 on the underlying substrate layer 52 via separate first bonding element layers 66a, preferably in the form of adhesive 68.

Figure 13A:
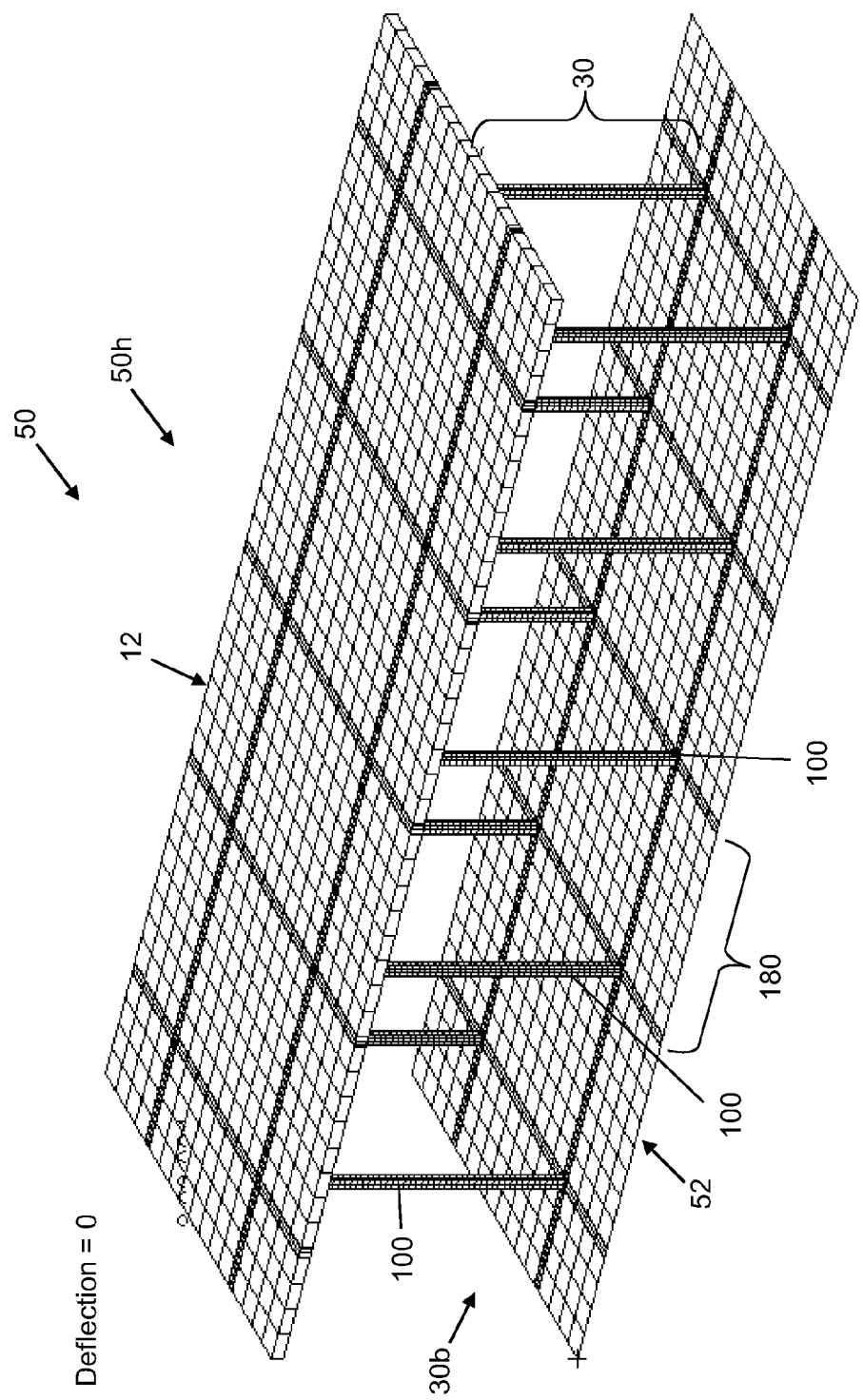
FIG. 13A is an illustration of a front perspective view of a finite element model simulating another one of the embodiments of a strain isolation layer assembly of the disclosure showing no pressure loading and no deflection.
Figure 13B:
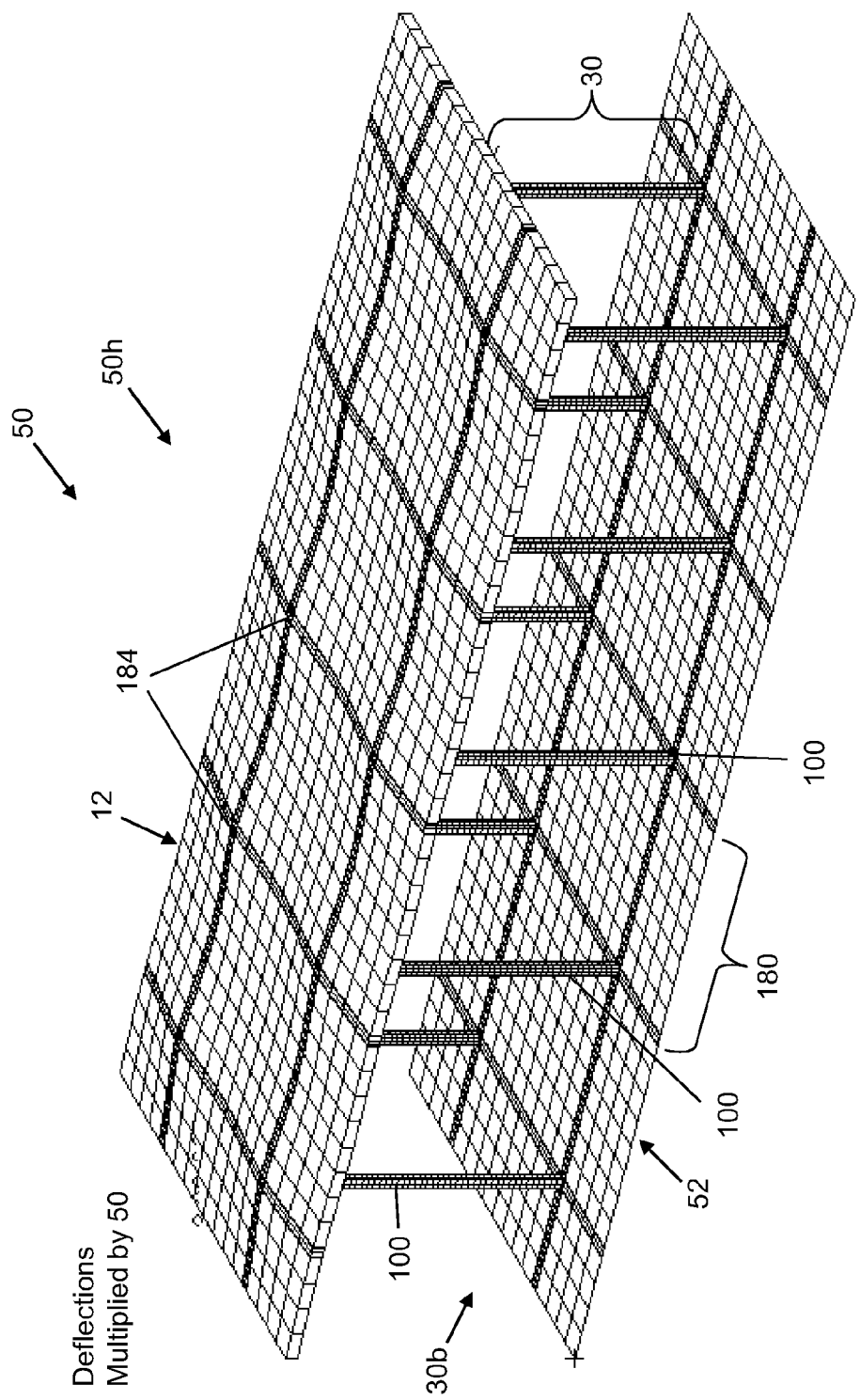
FIG. 13B is an illustration of a front perspective view of the strain isolation layer assembly of FIG. 13A showing a pressure loading effect and deflections multiplied by fifty (50)
Figure 13C:
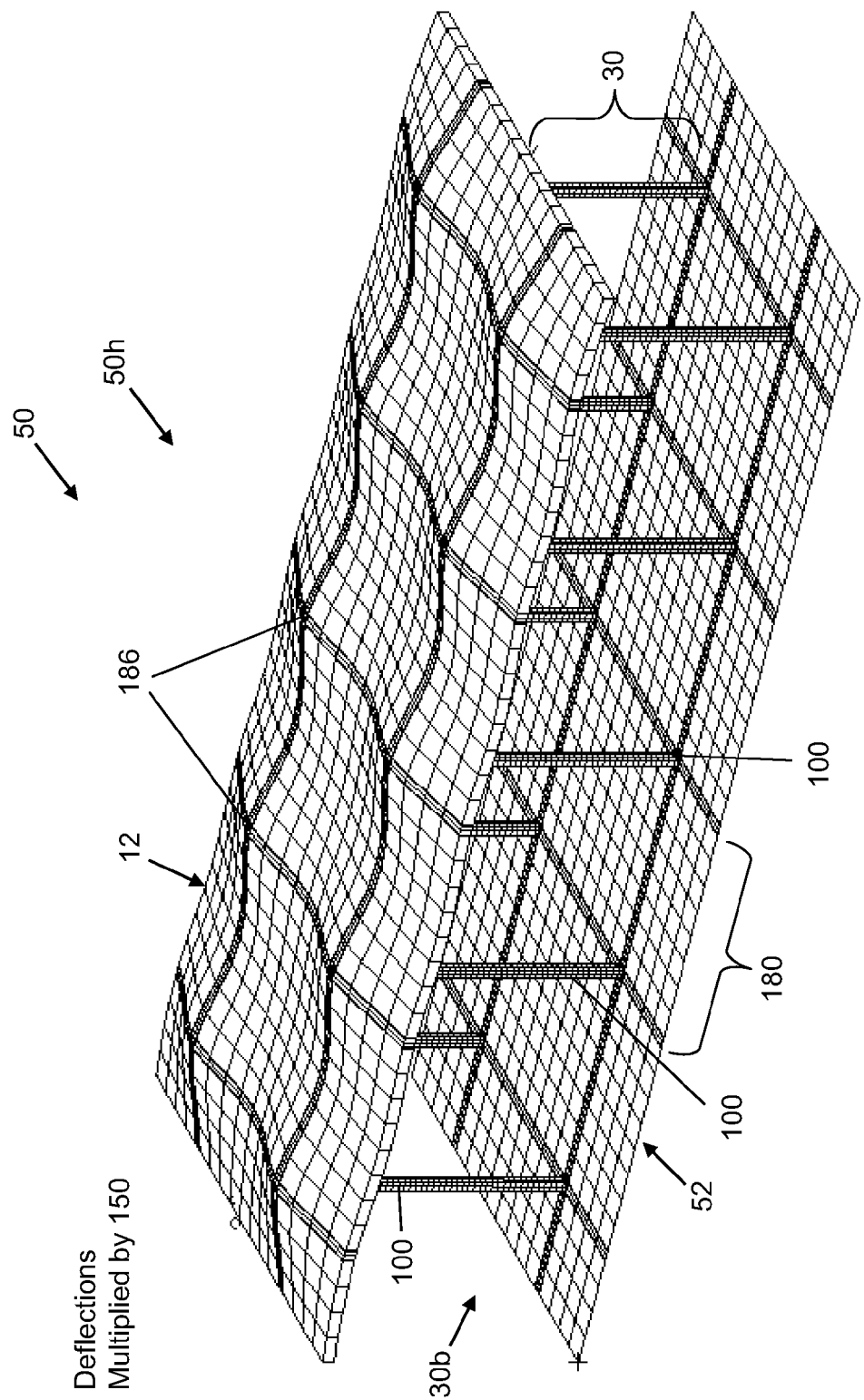
FIG. 13C is an illustration of a front perspective view of the strain isolation layer assembly of FIG. 13A showing a pressure loading effect and deflections multiplied by one hundred and fifty (150); and, FIG. 14 is a flow diagram illustrating an exemplary embodiment of a method of the disclosure.

FIGS. 13A-13C show the effect of column diameters or widths of a column support strain isolation layer 30b in relation to pressure loading of a strain isolation layer assembly 50h. FIG. 13A is an illustration of a front perspective view of one of the embodiments of strain isolation layer assembly 50, in the form of a strain isolation layer assembly 50h comprising the rigid solar layer 12, the strain isolation layer 30, and the underlying substrate layer 52. The strain isolation layer 30 is in the form of column support strain isolation layer 30b. FIG. 13A shows a spacing 180 between vertical column supports 100 of the column support strain isolation layer 30b of the strain isolation layer assembly 50h. FIG. 13A further shows no pressure loading and zero or no deflection of the vertical column supports 100 of the column support strain isolation layer 30b of the strain isolation layer assembly 50h.

FIG. 13B is an illustration of a front perspective view of the strain isolation layer assembly 50h of FIG. 13A showing a pressure loading effect and deflections multiplied by fifty (50). FIG. 13B shows pressure loading portions 184 on the rigid solar layer 12 when pressure is loaded onto the strain isolation layer assembly 50h. The shear stiffness of the strain isolation layer assembly 50h depends strongly on the diameter or width, as well as the length of the vertical column supports 100. FIG. 13C is an illustration of a front perspective view of the strain isolation layer assembly 50h of FIG. 13A showing a pressure loading effect and deflections multiplied by one hundred and fifty (150). FIG. 13C shows pressure loading portions 186 on the rigid solar layer 12 when pressure is loaded onto the strain isolation layer assembly 50h.

In another embodiment of the disclosure, there is provided an aircraft 10 (see FIG. 1) comprising a strain isolation layer 30 (see FIGS. 1, 4A-13C) having a discontinuous configuration 80 (see FIGS. 6, 7, 10, 11B, 12), a vertical rigidity 130 (see FIGS. 6, 10, 11B), and a horizontal shear flexibility 132 (see FIGS. 6, 10, 11B). The strain isolation layer 30 joins a rigid solar layer 12 to a flexible surface of a wing 20 of an aircraft 10 (see FIG. 1), such that the strain isolation layer 30 isolates the rigid solar layer 12 to reduce one or more strains 76 (see FIGS. 11D, 11F) induced on the rigid solar layer 12.

Figure 14:
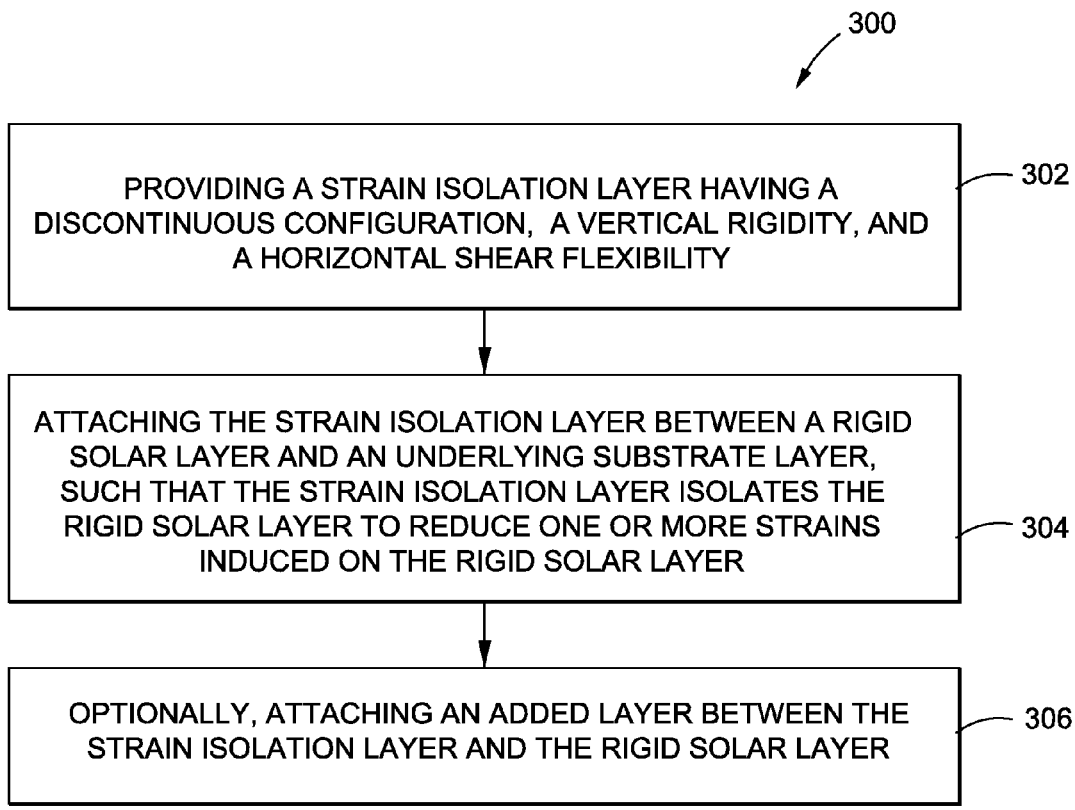

In another embodiment of the disclosure, there is provided a method 300 of reducing one or more strains 76 (see FIGS. 11D, 11F) on a rigid solar layer 12 (see FIGS. 1-13C). FIG. 14 is a flow diagram illustrating an exemplary embodiment of a method 300 of the disclosure. The method 300 comprises step 302 of providing a strain isolation layer 30 (see FIGS. 1, 4A-13C) having a discontinuous configuration 80 (see FIGS. 6, 7, 10, 11B, 12), a vertical rigidity 130 (see FIGS. 6, 10, 11B), and a horizontal shear flexibility 132 (see FIGS. 6, 10, 11B). The strain isolation layer 30 may comprise various embodiments, as discussed in detail above, including a perforated foam strain isolation layer 30a (see FIG. 7), a column support strain isolation layer 30b (see FIG. 6), a hinged support strain isolation layer 30c (see FIG. 10), a foam blade support strain isolation layer 30d (see FIG. 11A-11F), a looped fiber strain isolation layer 30e (see FIG. 12), and the sliced foam strain isolation layers 30f, 30g (see FIG. 8B-8C). The strain isolation layer 30, such as in the form of strain isolation layer embodiments 30a-30g, preferably have a shear modulus of about 0.0001 psi (pounds per square inch) to about 1 psi (pounds per square inch).

The method 300 further comprises step 304 of attaching the strain isolation layer 30, such as in the form of strain isolation layer embodiments 30a-30g, between a rigid solar layer 12 (see FIGS. 1-13C) and an underlying substrate layer 52 (see FIGS. 1, 4A-13C), such that the strain isolation layer 30 isolates the rigid solar layer 12 to reduce one or more strains 76 (see FIGS. 11D, 11F) induced on the rigid solar layer 12. The rigid solar layer 12 may comprise, as discussed in detail above, one or more solar panels 12a, one or more solar cells 40, a solar panel array 12b comprising one or more solar modules 38 of solar cells 40, a solar panel laminated assembly 46, or another suitable rigid solar layer. The one or more strains 76 may comprise a mechanical strain such as a compressive strain, a tensile strain or a torsional strain; and a thermal strain such as a differential thermal expansion strain relating to coefficients of thermal expansion of each material in a subsystem, or another type of strain. Embodiments of the underlying substrate layer 52 that may be used in the method 300 are discussed in detail above.

The method 300 further optionally comprises step 304 of attaching an added layer 70 (see FIGS. 5A-5D) between the strain isolation layer 30 and the rigid solar layer 12. Embodiments of the added layer 70 that may be used in the method 300 are discussed in detail above.

Disclosed embodiments of the strain isolation layer assembly 50, 50a-50h, 50j (see FIGS. 4A-13C) and method 300 provide an advantageous strain isolation layer 30 or pad to connect a rigid solar layer 12, such as a solar panel array, to an underlying substrate layer 52 or surface, such as an aircraft wing. Disclosed embodiments of the strain isolation layer 30, such as in the form of strain isolation layer embodiments 30a-30g, are relatively rigid in the vertical direction or out-of-plane direction d₁ 160 (see FIG. 11D) and are very compliant or flexible in the horizontal or in-plane direction d₂ 162 (see FIG. 11F). In addition, disclosed embodiments of the strain isolation layer assembly 50, 50a-50h, 50j (see FIGS. 4A-13C) and method 300 may be used to attach large, thin photovoltaic solar panel arrays to an aircraft wing surface or other structure while isolating the solar panel array from strains associated with wing flexure or differential thermal expansion. Further, disclosed embodiments of the strain isolation layer assembly 50, 50a-50h, 50j (see FIGS. 4A-13C) and method 300 provide a connection of a thin laminated solar layer or solar panel array to a complimentary structure to form a sandwich structure and provide connection of the sandwich structure to an underlying substrate layer 52, such as an aircraft, via a strain isolation layer 30 or pad.

Moreover, disclosed embodiments of the strain isolation layer assembly 50, 50a-50h, 50j (see FIGS. 4A-13C) and method 300 may be used to minimize, prevent or eliminate buckling or wrinkling of the rigid solar layer or solar panel array and may be used to reduce the loads into the rigid solar layer or solar panel array. Finally, disclosed embodiments of the strain isolation layer assembly 50, 50a-50h, 50j (see FIGS. 4A-13C) and method 300 provide efficient, less complex, and less costly assembly and manufacture than known assemblies and methods, and provide an aircraft or other structure having a reduced overall weight when the strain isolation layer assembly 50, 50a-50h, 50j is mounted or connected to the aircraft or other structure.

Many modifications and other embodiments of the disclosure will come to mind to one skilled in the art to which this disclosure pertains having the benefit of the teachings presented in the foregoing descriptions and the associated drawings. The embodiments described herein are meant to be illustrative and are not intended to be limiting or exhaustive. Although specific terms are employed herein, they are used in a generic and descriptive sense only and not for purposes of limitation.

What is claimed is:

1. A strain isolation layer assembly comprising:
   a rigid solar layer;
   a sandwich structure attached to the rigid solar layer, the sandwich structure comprising a core layer bonded between a first facesheet layer and a second facesheet layer, the first and second facesheet layers each comprised of a thermoplastic material selected from the group consisting of one or more of carbon fiber reinforced polypheylene sulfide (PPS), carbon fiber reinforced polyetheretherketone (PEEK), carbon fiber reinforced polyetherketoneketone (PEKK), and carbon fiber reinforced polyethyleneimine (PEI), and the first facesheet layer continuously mounted above the core layer and bonded to the rigid solar layer, and the second facesheet layer continuously mounted below the core layer;
   a strain isolation layer bonded below the second facesheet layer, the strain isolation layer having a discontinuous configuration, a vertical rigidity in an out-of-plane direction, and a horizontal shear flexibility in an in-plane direction; and,
   an underlying substrate layer;
   wherein the strain isolation layer is coupled between the rigid solar layer and the underlying substrate layer to form a strain isolation layer assembly, such that the strain isolation layer isolates the rigid solar layer to reduce one or more strains induced on the rigid solar layer.

2. The assembly of claim 1 wherein the core layer is comprised of a composite material selected from a group comprising polymethacrylimide (PMI) based structural foam, styrene foam, polyvinyl chloride (PVC) foam, urethane foam, polypropylene foam, polyimide foam, acrylic foam, carbon fiber reinforced plastics, aramid fiber reinforced plastics, polymer matrix composite material, and polyurethanes.

3. The assembly of claim 1 wherein the core layer comprises a thermoplastic honeycomb sandwich core.

4. The assembly of claim 1 wherein the rigid solar layer is selected from a group comprising one or more solar panels, one or more solar cells, a solar panel array comprising one or more solar modules of solar cells, and a solar panel laminated assembly.

5. The assembly of claim 1 wherein the rigid solar layer has a thickness in a range of from about 0.006 inch to about 0.030 inch.

6. The assembly of claim 1 wherein the strain isolation layer is selected from a group comprising a perforated foam strain isolation layer, a column support strain isolation layer, a hinged support strain isolation layer, a foam blade support strain isolation layer, a looped fiber strain isolation layer, and a sliced foam strain isolation layer.

7. The assembly of claim 1 wherein the vertical rigidity of the strain isolation layer stabilizes the rigid solar layer to resist compressive buckling and wrinkling.

8. The assembly of claim 1 wherein the strain isolation layer has a shear modulus of about 0.03 psi (pounds per square inch) to about 1 psi (pounds per square inch).

9. The assembly of claim 1 wherein the horizontal shear flexibility reduces a structural strain and a thermal strain between the underlying substrate layer and the rigid solar layer.

10. The assembly of claim 1 wherein the underlying substrate layer is a structure selected from a group comprising an aircraft, a spacecraft, a satellite, a space station, a rotorcraft, a watercraft, an automobile, a truck, a bus, and an architectural structure.

11. The assembly of claim 1 wherein the one or more strains is selected from a group comprising a mechanical strain selected from a group comprising a compressive strain, a tensile strain and a torsional strain; and a thermal strain comprising a differential thermal expansion strain relating to coefficients of thermal expansion.

12. An aircraft comprising:
   a strain isolation layer having a discontinuous configuration, a vertical rigidity in an out-of-plane direction, and a horizontal shear flexibility in an in-plane direction; and,
   the strain isolation layer joining a rigid solar layer attached to a sandwich structure to a surface of a flexible aircraft wing, such that the strain isolation layer isolates the rigid solar layer to reduce one or more strains induced on the rigid solar layer, and,
   the sandwich structure comprising a core layer bonded between a first facesheet layer and a second facesheet layer via respective bonding element layers, the first and second facesheet layers each comprised of a thermoplastic material selected from the group consisting of one or more of carbon fiber reinforced polypheylene sulfide (PPS), carbon fiber reinforced polyetheretherketone (PEEK), carbon fiber reinforced polyetherketoneketone (PEKK), and carbon fiber reinforced polyethyleneimine (PEI), and the first facesheet layer continuously mounted above the core layer and bonded to the rigid solar layer via another bonding element layer, and the second facesheet layer continuously mounted below the core layer and bonded to the strain isolation layer via another bonding element layer.

13. The aircraft of claim 12 wherein the core layer is comprised of a composite material selected from a group comprising polymethacrylimide (PMI) based structural foam, styrene foam, polyvinyl chloride (PVC) foam, urethane foam, polypropylene foam, polyimide foam, acrylic foam, carbon fiber reinforced plastics, aramid fiber reinforced plastics, polymer matrix composite material, and polyurethanes.

14. The aircraft of claim 12 wherein the rigid solar layer is selected from a group comprising one or more solar panels, one or more solar cells, a solar panel array comprising one or more solar modules of solar cells, and a solar panel laminated array.

15. The aircraft of claim 12 wherein the strain isolation layer is selected from a group comprising a perforated foam strain isolation layer, a column support strain isolation layer, a hinged support strain isolation layer, a foam blade support strain isolation layer, a looped fiber strain isolation layer, and a sliced foam strain isolation layer.

16. The aircraft of claim 12 wherein the strain isolation layer has a shear modulus of about 0.03 psi (pounds per square inch) to about 1 psi (pounds per square inch).

17. The aircraft of claim 12 wherein the one or more strains is selected from a group comprising a mechanical strain selected from a group comprising a compressive strain, a tensile strain and a torsional strain; and a thermal strain comprising a differential thermal expansion strain relating to coefficients of thermal expansion.

18. A method of reducing one or more strains on a rigid solar layer, the method comprising:
providing a strain isolation layer having a discontinuous configuration, a vertical rigidity in an out-of-plane direction, and a horizontal shear flexibility in an in-plane direction; and,
attaching the strain isolation layer between a rigid solar layer attached to a sandwich structure and an underlying substrate layer, such that the strain isolation layer isolates the rigid solar layer to reduce one or more strains induced on the rigid solar layer, and,
the sandwich structure comprising a core layer bonded between a first facesheet layer and a second facesheet layer, the first and second facesheet layers each comprised of a thermoplastic material selected from the group consisting of one or more of carbon fiber reinforced polypheylene sulfide (PPS), carbon fiber reinforced polyetheretherketone (PEEK), carbon fiber reinforced polyetherketoneketone (PEKK), and carbon fiber reinforced polyethyleneimine (PEI), and the first facesheet layer continuously mounted above the core layer and bonded to the rigid solar layer, and the second facesheet layer continuously mounted below the core layer and bonded to the strain isolation layer.

19. The method of claim 18 wherein the core layer is comprised of a composite material selected from a group comprising polymethacrylimide (PMI) based structural foam, styrene foam, polyvinyl chloride (PVC) foam, urethane foam, polypropylene foam, polyimide foam, acrylic foam, carbon fiber reinforced plastics, aramid fiber reinforced plastics, polymer matrix composite material, and polyurethanes.

20. The method of claim 18 wherein the rigid solar layer is selected from a group comprising one or more solar panels, one or more solar cells, a solar panel array comprising one or more solar modules of solar cells, and a solar panel laminated array.

21. The method of claim 18 wherein the strain isolation layer is selected from a group comprising a perforated foam strain isolation layer, a column support strain isolation layer, a hinged support strain isolation layer, a foam blade support strain isolation layer, a looped fiber strain isolation layer, and a sliced foam strain isolation layer.

22. The method of claim 18 wherein the strain isolation layer has a shear modulus of about 0.03 psi (pounds per square inch) to about 1 psi (pounds per square inch).

23. The method of claim 18 wherein the one or more strains is selected from a group comprising a mechanical strain selected from a group comprising a compressive strain, a tensile strain and a torsional strain; and a thermal strain comprising a differential thermal expansion strain relating to coefficients of thermal expansion.

* * * * *